US012787367B2

(12) United States Patent
Doornbos et al.

(10) Patent No.: US 12,787,367 B2
(45) Date of Patent: Nov. 3, 2026

(54) FERROELECTRIC FIELD EFFECT TRANSISTOR AND METHODS OF FORMING THE SAME

(71) Applicant: TAIWAN SEMICONDUCTOR MANUFACTURING COMPANY, LTD., Hsinchu (TW)

(72) Inventors: Gerben Doornbos, Kessel-Lo (BE); Oreste Madia, Leuven (BE); Georgios Vellianitis, Heverlee (BE); Marcus Johannes Henricus Van Dal, Linden (BE)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1120 days.

(21) Appl. No.: 17/827,755

(22) Filed: May 29, 2022

(65) Prior Publication Data

US 2023/0387296 A1 Nov. 30, 2023

(51) Int. Cl.

| | |
|---|---|
| ***H10D 30/69*** | (2025.01) |
| ***H10D 30/62*** | (2025.01) |
| ***H10D 64/68*** | (2025.01) |

(52) U.S. Cl.

CPC ....... *H10D 30/701* (2025.01); *H10D 30/6211* (2025.01); *H10D 30/6219* (2025.01); *H10D 64/689* (2025.01)

(58) Field of Classification Search

None

See application file for complete search history.

(56) References Cited

U.S. PATENT DOCUMENTS

| | | | |
|---|---|---|---|
| 6,462,366 B1 | 10/2002 | Hsu et al. | |
| 2017/0373198 A1 | 12/2017 | Ramaswamy et al. | |
| 2023/0387296 A1* | 11/2023 | Doornbos .............. | H10B 51/30 |

* cited by examiner

*Primary Examiner* — Jack S Chen

(74) *Attorney, Agent, or Firm* — NZ Carr Law Office

(57) ABSTRACT

A device and methods of forming the same are described. The device includes a substrate, source/drain regions disposed over the substrate, a ferroelectric layer disposed over the substrate, a gate electrode in contact with the ferroelectric layer, a first conductive contact disposed at a first end of the gate electrode, and a second conductive contact disposed at a second end opposite the first end of the gate electrode. The first and second conductive contacts are configured to allow a current to flow from the first conductive contact through the gate electrode to the second conductive contact.

20 Claims, 41 Drawing Sheets

FERROELECTRIC FIELD EFFECT TRANSISTOR AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Several novel non-volatile memory devices have emerged over the years. One of them is a ferroelectric field effect transistor (FeFET). In some examples, a FeFET includes a ferroelectric layer disposed between the gate electrode and the channel. As devices are scaled down, the introduction of the ferroelectric layer may pose additional challenges in scaling down FeFETs. For example, conventional ferroelectric materials may give rise to sufficient polarization when they are formed to sufficient thicknesses. The thickness of the ferroelectric layer may increase the write voltage. Therefore, although FeFETs have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
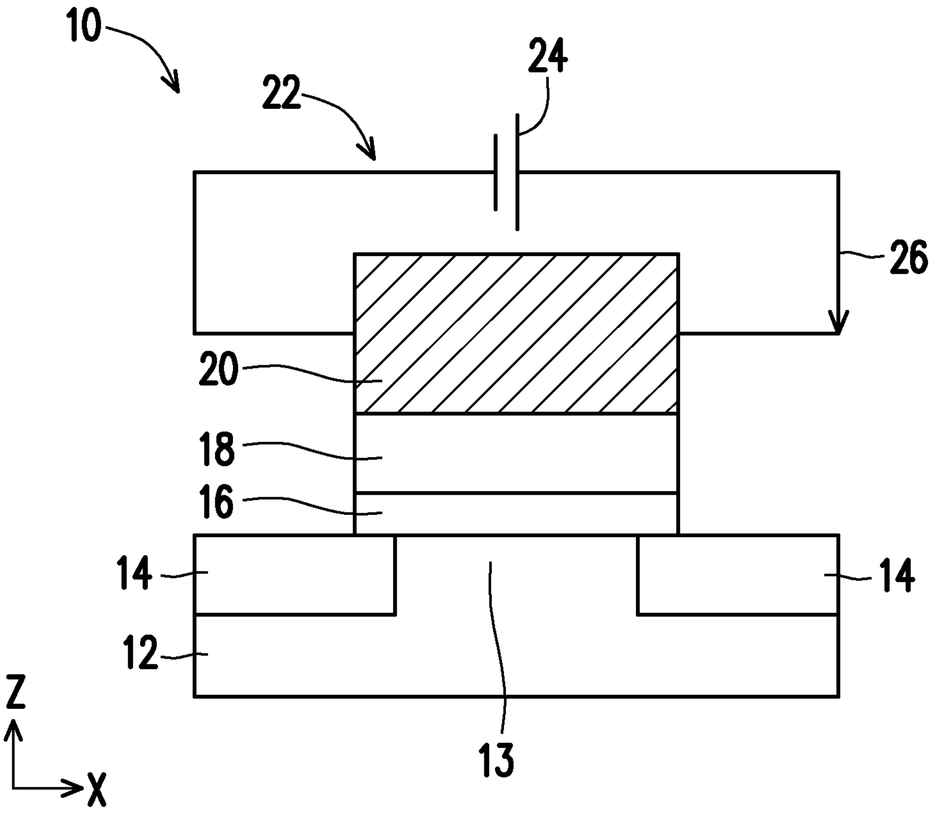
FIG. 1 is a cross-sectional side view of a ferroelectric field effect transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Researches have been done to identify memory devices that are integratable with existing IC fabrication processes, are non-volatile, and have low power consumption. One of the investigated concepts is a ferroelectric field effect transistor (FeFET) that has a ferroelectric layer disposed between the gate electrode and the channel. As a result, the ferroelectric layer of a FeFET becomes a part of the gate structure that is disposed over the channel. The FeFET stores information in the polarization state of the ferroelectric layer. The polarization state of a ferroelectric layer is described by a vector with constant magnitude, and which can point in two opposite directions, for example upward and downward. In an n-channel FET, upward polarization gives a high threshold voltage, while downward polarization gives a low threshold voltage. By sensing the transistor current at a certain read voltage, the upward and downward polarization states can be distinguished. However, inclusion of the ferroelectric layer in the gate structure of an FeFET presents several challenges. For example, because ferroelectricity is a bulk property, the ferroelectric layer may require sufficient thickness to exhibit ferroelectricity. With such sufficient thickness, the write voltage may be increased. On the other hand, if the thickness of the ferroelectric layer is below the sufficient thickness, the write voltage may be reduced, but the ferroelectric properties may be lost. Furthermore, a thinner ferroelectric layer tends to be leaky and has poor endurance.

The present disclosure provides an FeFET having a ferroelectric layer, and the temperature of the ferroelectric layer can be increased prior to or during the write operation of the FeFET in order to reduce the potential barrier that separates the two polarization states. With the potential barrier between the two polarization states being reduced by the elevated temperature, the coercive field of the ferroelectric layer reduces, and the write voltage may be reduced without sacrificing the thickness of the ferroelectric layer.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 is a cross-sectional side view of an FeFET 10, in accordance with some embodiments. As shown in FIG. 1, the FeFET 10 includes a substrate 12, source/drain (S/D) regions 14, an interfacial layer 16 disposed over the substrate 12, a ferroelectric layer 18 disposed on the interfacial layer 16, and a gate electrode 20 disposed on the ferroelectric layer 18. The substrate 12 may be a semiconductor substrate. For example, the substrate 12 can include silicon or a compound semiconductor, such as gallium arsenide (GaAs), indium phosphide (InP), silicon germanium (SiGe), silicon carbide (SiC), other suitable semiconductor materials, and/or combinations thereof. The substrate 12 may be doped with a dopant, such as an n-type dopant or a p-type dopant. The S/D regions 14 may be formed in the substrate 12. The S/D regions 14 may be doped with a dopant, such as an n-type dopant or a p-type dopant. S/D region(s) may refer to a source or a drain, individually or collectively dependent upon the context. A channel region 13 is disposed between the S/D regions 14. In some embodiments, the substrate 12 is silicon doped with a p-type dopant, such as boron, and the S/D regions 14 include silicon doped with an n-type dopant, such as arsenic. The S/D regions 14 may be surrounded by an isolation layer (not shown), such as shallow trench isolation (STI).

The interfacial layer 16 is disposed on the channel region 13. The interfacial layer 16 may include an oxide, such as silicon oxide. In some embodiments, the interfacial layer 16 is optional. In some embodiments, the interfacial layer 16 is the native oxide formed on the substrate 12. The ferroelectric layer 18 is disposed on the interfacial layer 16. The ferroelectric layer 18 may be a ferroelectric insulator, such as a dielectric material having ferroelectric properties. In some embodiments, the ferroelectric layer 18 may be a high-k dielectric layer having dielectric constant greater than about 3.9. For example, the ferroelectric layer 18 may include a high-k dielectric such as a hafnium-based oxide material, such as hafnium dioxide ($HfO_2$). Other suitable ferroelectric dielectric material can be used. In some embodiments, the ferroelectric layer 18 can be a hafnium-based film doped with any suitable elements, such as, for example, zirconium, aluminum, lanthanum, titanium, tantalum, silicon, yttrium, scandium, any other suitable element, or combinations thereof. In some embodiments, the ferroelectric layer 18 may include a thickness along the z direction between about 4 nanometer (nm) and about 20 nm.

The gate electrode 20 is disposed on the ferroelectric layer 18. The gate electrode 20 may include one or more layers. For example, the gate electrode 20 may include one or more work function layers and a bulk layer. In some embodiments, the work function layer includes one or more layers of electrically conductive material, such as a single layer of TiN, TaN, TaAlC, TiC, TaC, Co, Al, TiAl, HfTi, TiSi, TaSi or TiAlC, or a multilayer of two or more of these materials. The bulk layer may include an electrically conductive material, such as a metal. In some embodiments, the bulk layer includes W, Cu, Ti, Al, or Co. The gate electrode 20 may include additional layers, such as glue layer, barrier layer, capping layer, or any suitable layer. The work function layer and the additional layers may be optional.

In order to increase the temperature of the ferroelectric layer 18 prior to or during the write operation of the FeFET 10, the gate electrode 20 is part of a heater circuit 22. The heater circuit 22 includes a voltage source 24 electrically connected to the gate electrode 20, such as the bulk layer. In some embodiments, two conductive contacts 42 (FIG. 3A) are disposed on the gate electrode 20, and the voltage source 24 generates a potential difference across the two conductive contacts. As a result, a current 26 flows through the gate electrode 20 and generates heat by Joule heating in the gate electrode 20 due to the electrical resistance of the gate electrode 20. The heat is then transferred to the ferroelectric layer 18. The voltage applied to the gate electrode 20 does not cause the FeFET 10 to be in operation, because the voltage applied is substantially less than the coercive voltage (the voltage at which the electric field over the ferroelectric layer exceeds the coercive field, resulting in flipping the orientation of the polarization). The purpose of the heater circuit 22 is to increase the temperature of the ferroelectric layer 18, which reduces the potential barrier between the two polarization states. In other words, the heating of the ferroelectric layer 18 dynamically reduces the coercive field, thereby reducing write voltage during write operation. In some embodiments, the temperature of the ferroelectric layer 18 is increased by about 10 degrees Celsius to about 99 degrees Celsius. If the temperature of the ferroelectric layer 18 is increased by less than 10 degrees Celsius, the potential barrier between the two polarization states may not be sufficiently reduced. On the other hand, if the temperature of the ferroelectric layer 18 is increased by over 99 degrees Celsius, the ferroelectric nature of the dielectric layer may degrade. The temperature of the ferroelectric layer 18 is increased just before the FeFET 10 is in write operation, such as about milliseconds before writing data onto the FeFET 10, so the ferroelectric layer 18 is at an elevated temperature during write operation.

Figure 2A:
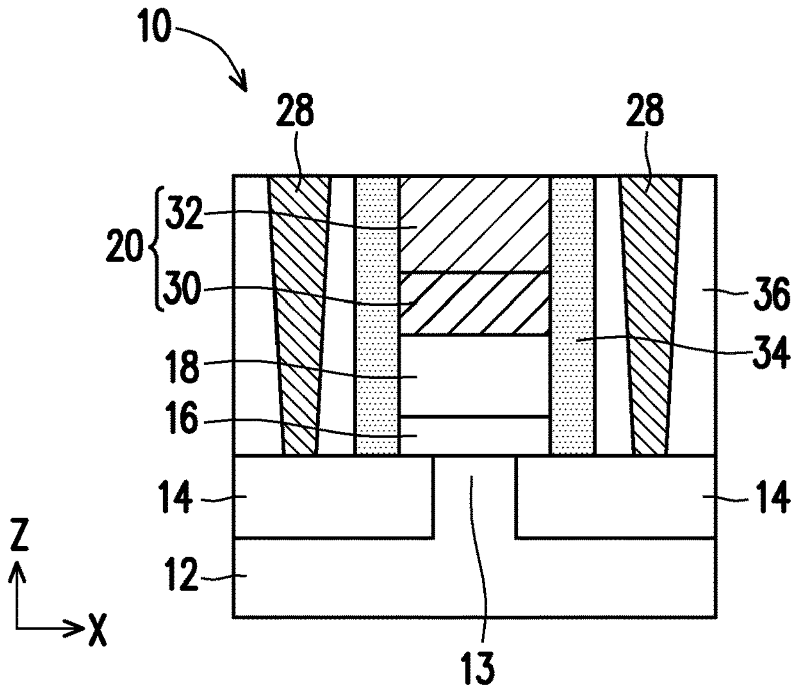
FIGS. 2A-2D are cross-sectional side views of various stages of manufacturing the ferroelectric field effect transistor of FIG. 1, in accordance with some embodiments.

FIGS. 2A-2D are cross-sectional side views of various stages of manufacturing the FeFET 10 of FIG. 1, in accordance with some embodiments. As shown in FIG. 2A, the FeFET 10 includes the substrate 12, the S/D regions 14, the channel region 13, the interfacial layer 16, the ferroelectric layer 18, and the gate electrode 20. In some embodiments, as described above, the gate electrode 20 includes the one or more work function layers 30 and the bulk layer 32. The FeFET 10 may further include gate spacers 34, an interlayer dielectric (ILD) 36, and conductive contacts 28 formed in the ILD 36.

The ILD 36 may include a dielectric material. In some embodiments, the dielectric material includes silicon oxide, silicon nitride, silicon oxynitride, spin-on glass (SOG), fluorinated silica glass (FSG), carbon doped silicon oxide (e.g., SiCOH), amorphous fluorinated carbon, polyimide, other proper porous polymeric materials, other suitable dielectric materials, and/or combinations thereof. The gate spacers 34 may be formed on the sidewalls of the gate electrode 20, the ferroelectric layer 18, and the interfacial layer 16. The gate spacers 34 may include multiple sub-spacers and are not illustrated in FIGS. 2A-2D for clarity. The gate spacers 34 may include a dielectric material such as, for example, silicon oxide, silicon nitride, silicon oxynitride, any other suitable dielectric material, and/or combinations thereof.

The conductive contacts 28 may be electrically connected to corresponding S/D regions 14. The conductive contacts 28 may include an electrically conductive material, such as a metal. In some embodiments, the conductive contacts 28 includes W, Co, Cu, or other suitable metal. A silicide layer (not shown) may be formed between each conductive contact 28 and the corresponding S/D region 14.

Figure 2B:
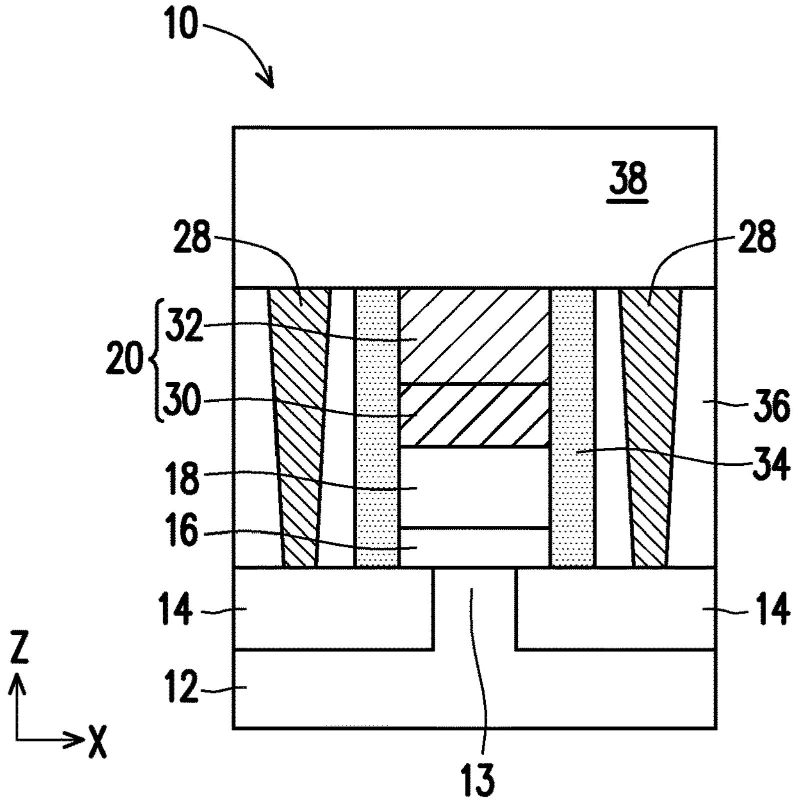
Figure 2C:
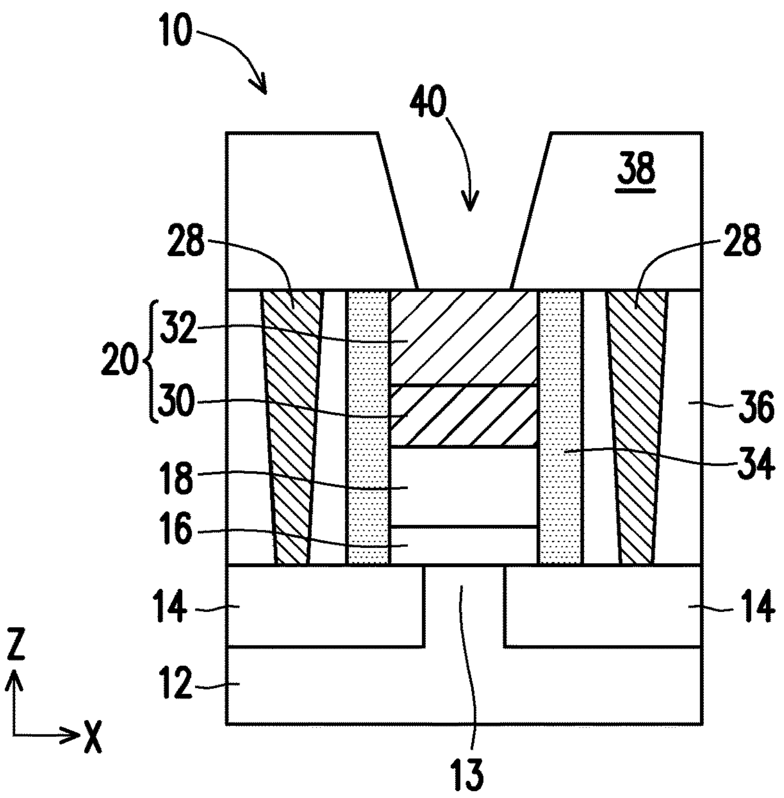
Figure 2D:
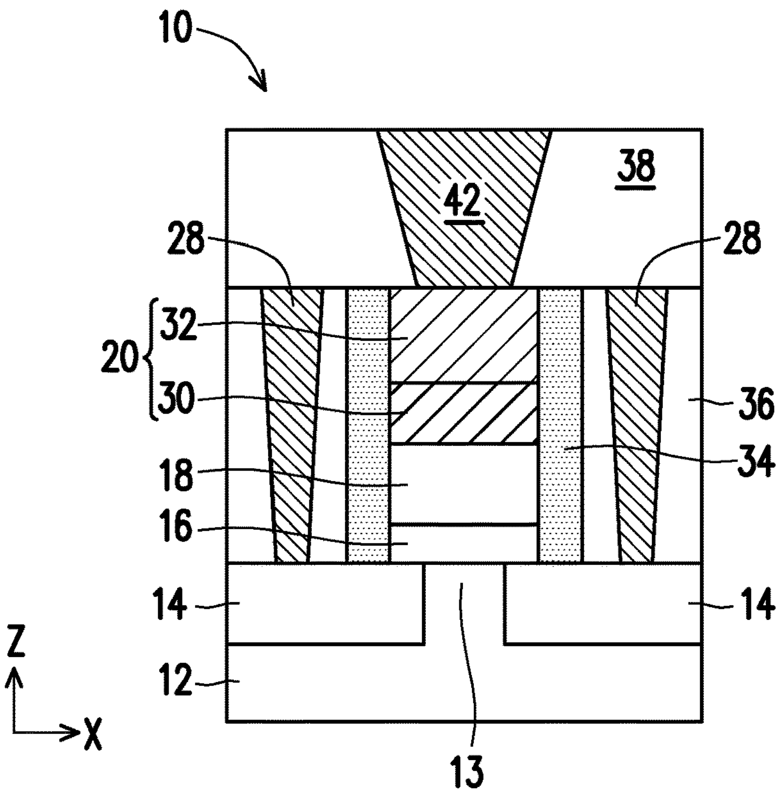

As shown in FIG. 2B, a dielectric material 38 is formed on the ILD 36, the conductive contacts 28, the gate electrode 20, and the gate spacers 34. The dielectric material 38 may include the same material as the ILD 36. As shown in FIG. 2C, two openings 40 (only one is shown) are formed in the dielectric material 38. The openings 40 may be filled with conductive contacts 42, as shown in FIG. 2D. The conductive contact 42 includes an electrically conductive material, such as a metal. In some embodiments, the conductive contact 42 includes W, Co, Cu, Pd, or other suitable metal. In some embodiments, the conductive contact 42 may include a barrier layer (not shown) and/or a liner (not shown).

Figure 3A:
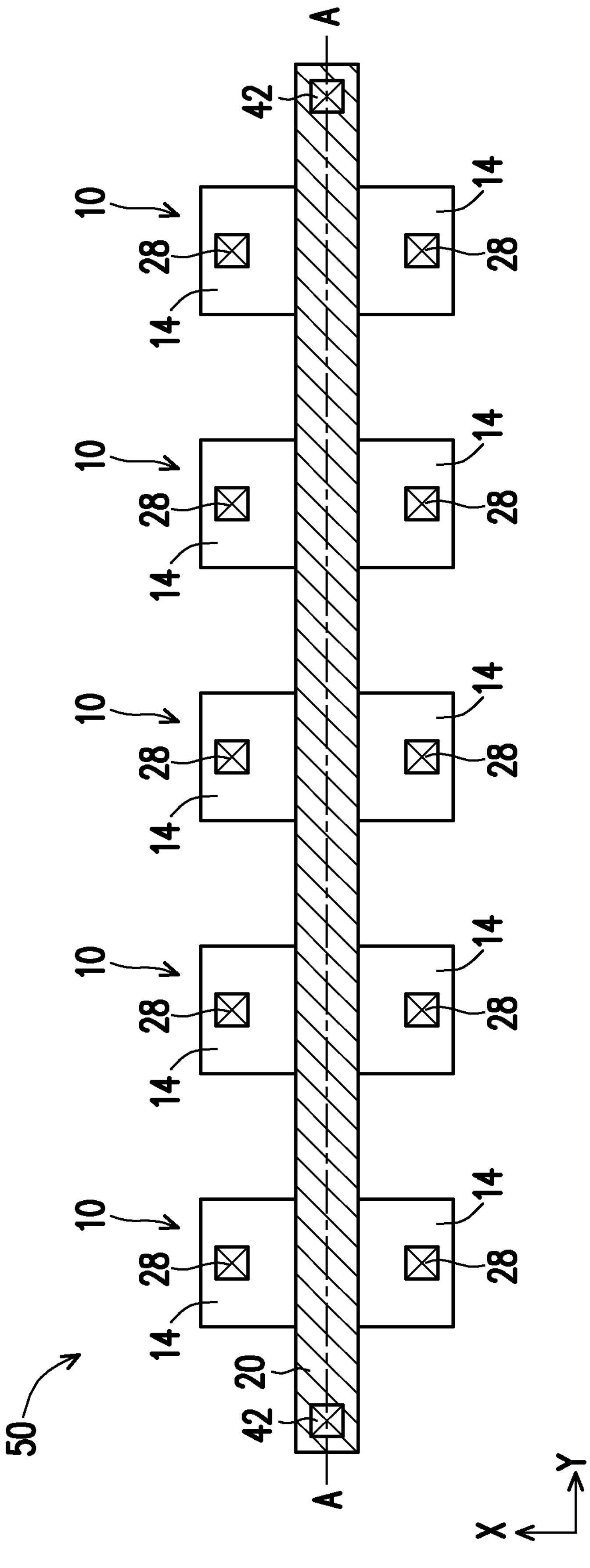
FIGS. 3A and 3B are various views of a row of the ferroelectric field effect transistors of FIG. 1, in accordance with some embodiments.
Figure 3B:
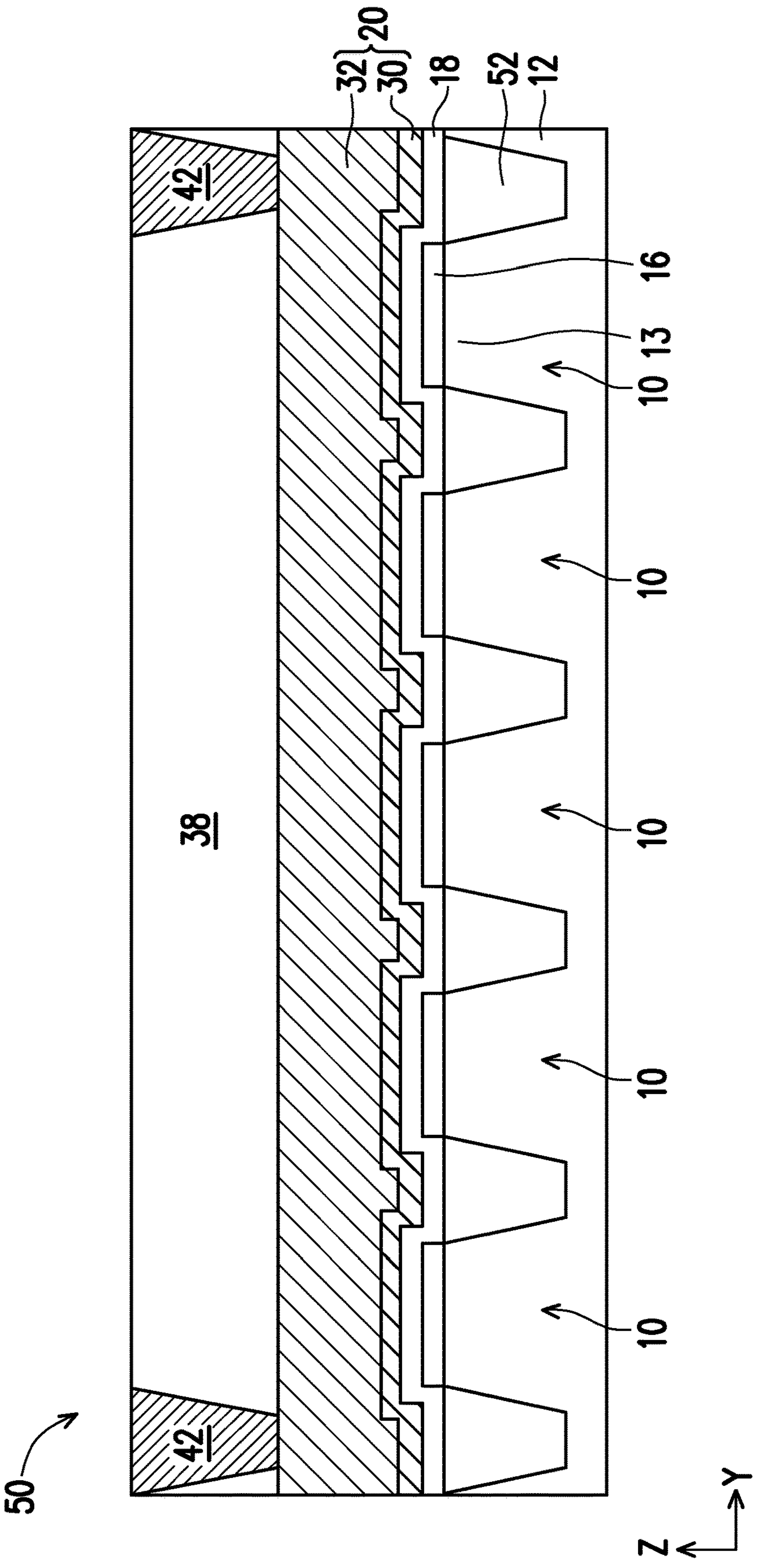

FIGS. 3A and 3B are various views of a row 50 of the FeFETs 10 of FIG. 1, in accordance with some embodiments. FIG. 3A is a schematic top view of the row 50. Some components of the FeFET 10, such as the dielectric material 38, the ILD 36, and the gate spacers 34, may be omitted for clarity in FIG. 3A. Furthermore, the components shown in FIG. 3A may be located at different levels along the z direction. As shown in FIG. 3A, the row 50 of the FeFETs 10 includes five FeFETs 10. However, the row 50 may include any number of the FeFETs 10. Each FeFET 10 includes the S/D regions 14 and corresponding conductive contacts 28. The five FeFETs 10 share one gate electrode 20, and two conductive contacts 42 are disposed on opposite ends of the gate electrode 20. As described above, prior to write operation of the FeFETs 10, the voltage source 24 (FIG. 1) generates a potential difference across the conductive contacts 42, and the current 26 (FIG. 1) is flowed through the gate electrode 20 from one conductive contact 42 to the other conductive contact 42. During write operation of the FeFETs 10, the same write voltage is applied to both conductive contacts 42, so that there is zero potential difference across the conductive contacts 42, and there is no current flowing through the gate electrode 20 from one of the conductive contacts 42 to the other conductive contact 42.

FIG. 3B is a cross-sectional side view of the row 50 of the FeFETs 10 of FIG. 3A taken along cross-section A-A, in accordance with some embodiments. As shown in FIG. 3B, an isolation layer 52 is disposed between adjacent channel regions 13. The isolation layer 52 may be the STI, as described above. In some embodiments, as shown in FIG. 3B, the interfacial layer 16 is disposed on the channel region 13 but not on the isolation layer 52. In some embodiments, the interfacial layer 16 is disposed on both the channel region 13 and the isolation layer 52. In some embodiments, the ferroelectric layer 18 and the one or more work function layers 30 are conformal layers and are formed by a conformal process, such as atomic layer deposition (ALD).

Figure 4A:
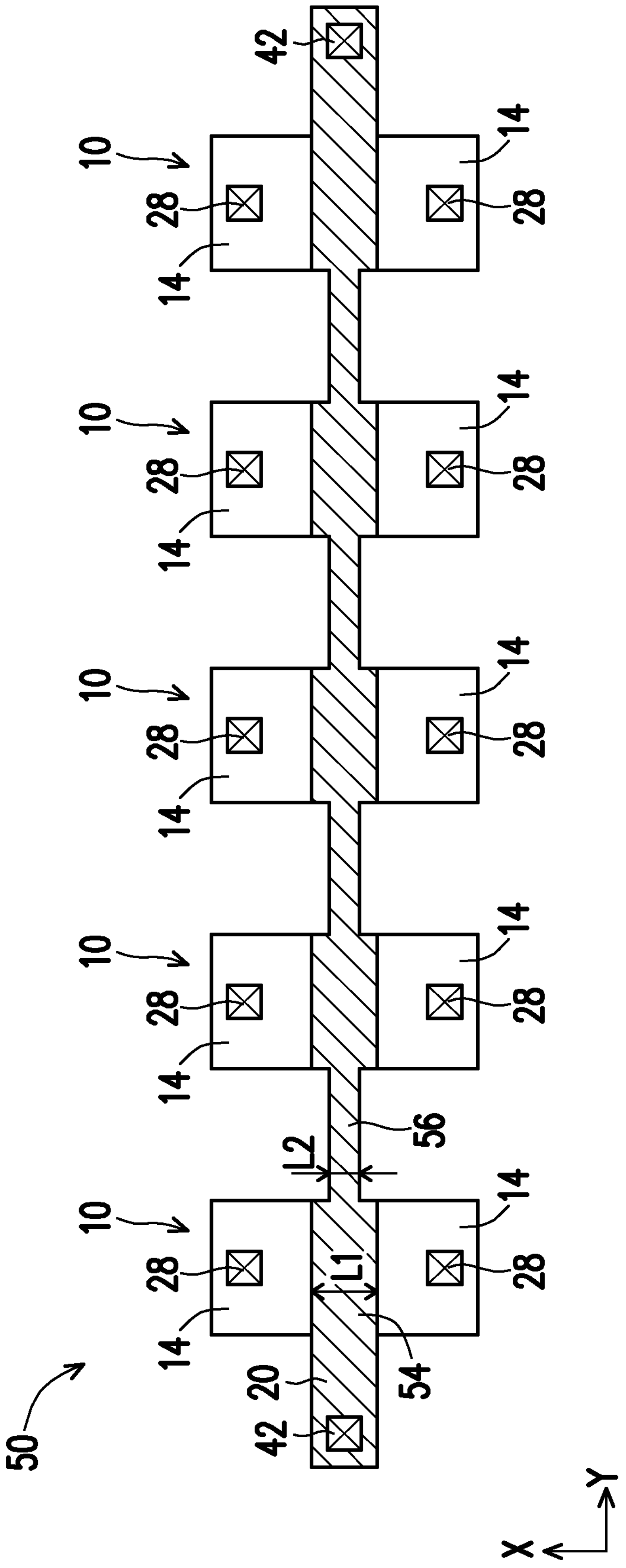
FIGS. 4A and 4B are top views of the row of the ferroelectric field effect transistors of FIG. 1, in accordance with alternative embodiments.
Figure 4B:
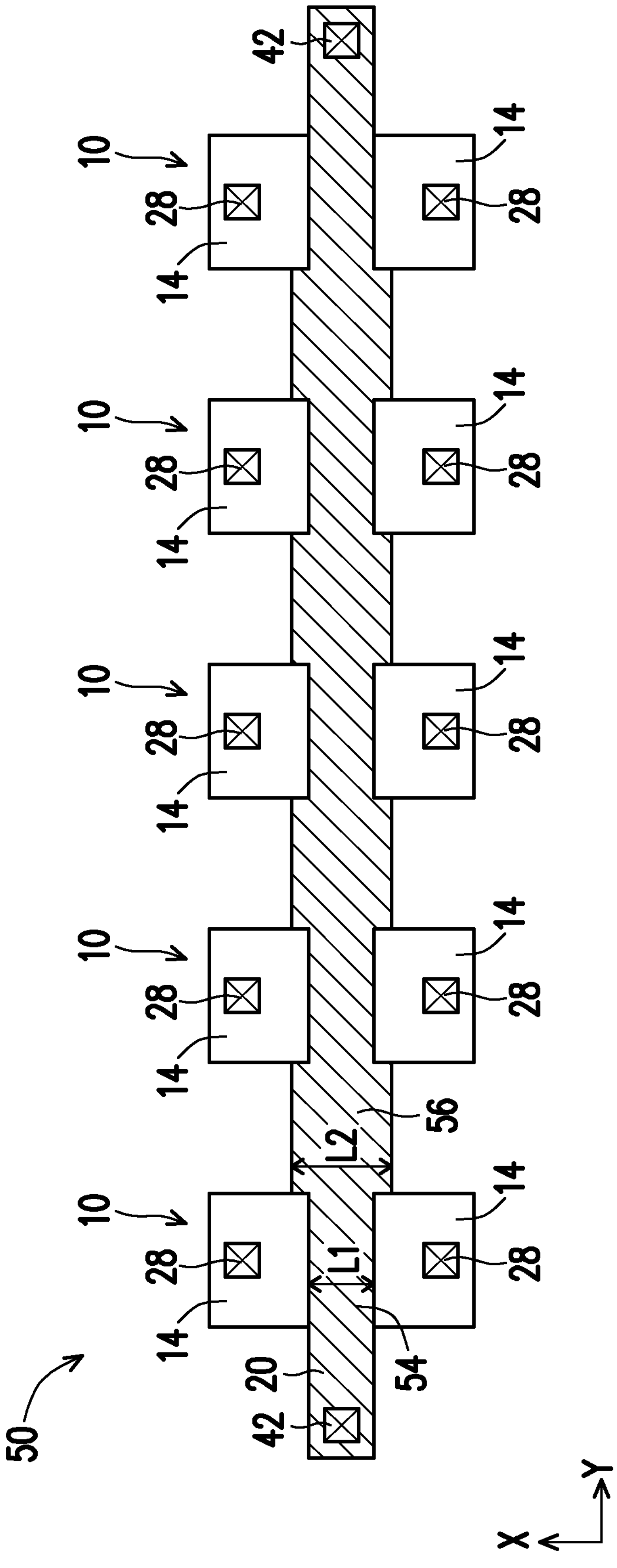

FIGS. 4A and 4B are top views of the row 50 of the FeFETs 10 of FIG. 1, in accordance with alternative embodiments. As shown in FIG. 4A, the gate electrode 20 including alternating first and second portions 54, 56. The first portion 54 of the gate electrode 20 may be disposed over the channel region 13 (FIG. 3B), or the active region, and the second portion 56 of the gate electrode 20 may be disposed over the isolation layer 52 (FIG. 3B). In some embodiments, the length L1 of the first portion 54 may be the gate length that is fixed by the device specification. Thus, in order to generate more heat without changing the gate length, the length L2 of the second portion 56 may be reduced. In other words, the active portions of the gate electrode 20, such as the first portions 54, have the first length L1 that is fixed by the device specification, while the inactive portions of the gate electrode 20, such as the second portions 56, have the second length L2 that is substantially smaller than the first length L1. As a result, more heat is generated in the second portions 56 due to the smaller length L2, which transfers to the first portions 54 due to good thermal conductivity of the material(s) of the gate electrode 20.

In some embodiments, as shown in FIG. 4B, the length L2 of the second portions 56 is substantially greater than the first length L1 of the first portions 54. With this configuration, heat is primarily generated in the active regions where the electrical resistance is the highest due to the smaller length L1. The gate electrode 20 having different lengths L1, L2 may be formed using a patterned mask (not shown). In some embodiments, the interfacial layer 16, the ferroelectric layer 18, the one or more work function layers 30, and the bulk layer 32 all have the pattern of the gate electrode 20 shown in FIG. 4A or FIG. 4B.

Figure 5:
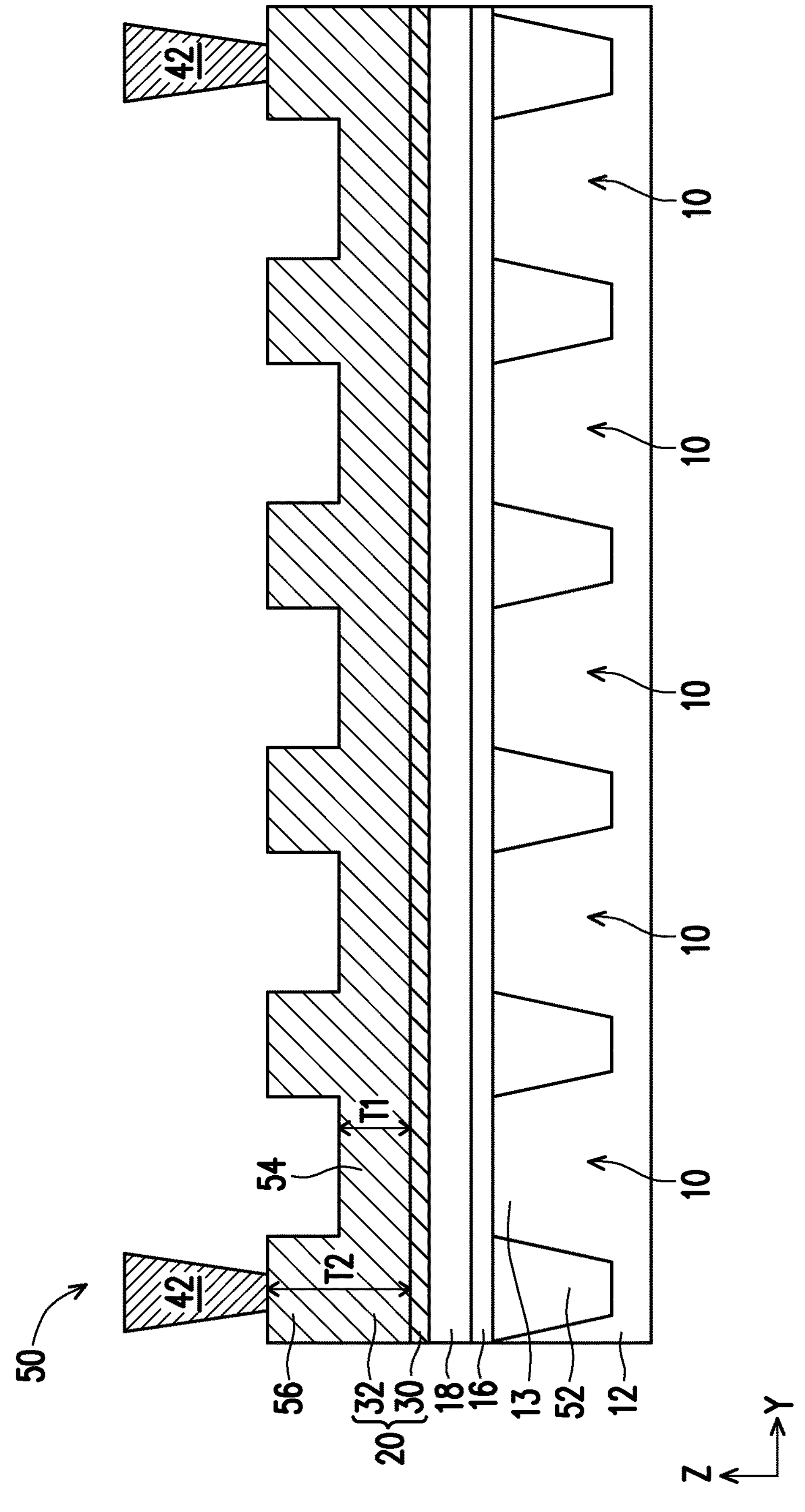
FIG. 5 is a cross-sectional side view of the row of the ferroelectric field effect transistors of FIG. 1, in accordance with alternative embodiments.

FIG. 5 is a cross-sectional side view of the row 50 of the FeFETs 10 of FIG. 1, in accordance with alternative embodiments. The dielectric material 38 is omitted in FIG. 5 for clarity. Instead of varying the length of the gate electrode 20, the thickness of the gate electrode 20 may be varied. In some embodiments, as shown in FIG. 5, the first portions 54 and the second portions 56 have different thicknesses. In some embodiments, similar to the gate electrode 20 shown in FIGS. 4A and 4B, the gate electrode 20 includes alternating first and second portions 54, 56. The first portion 54 has a first thickness T1 along the z direction, and the second portion 56 has a second thickness T2 different from the first thickness T1. In some embodiments, the first thickness T1 is substantially less than the second thickness T2, as shown in FIG. 5. As a result, more heat is generated in the active regions due to the smaller first thickness T1. In some embodiments, the first thickness T1 is substantially greater than the second thickness T2. In some embodiments, the length of the gate electrode 20 along the x direction may be constant, such as the gate electrode 20 shown in FIG. 3A. In some embodiments, both the thickness and length of the gate electrode 20 may be varied. For example, the gate electrode 20 may include varying thicknesses T1 and T2 as shown in FIG. 5 and varying lengths L1 and L2 as shown in FIG. 4A or 4B.

Figure 6A:
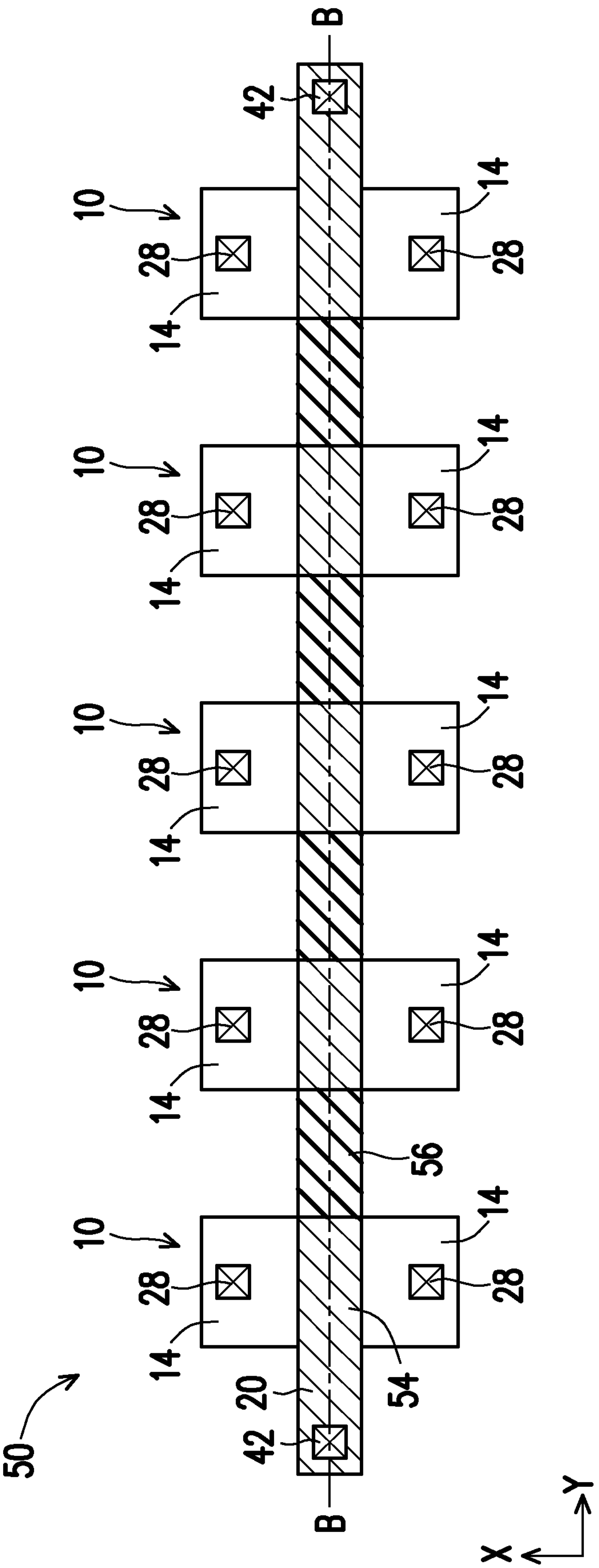
FIGS. 6A and 6B are various views of the row of the ferroelectric field effect transistors of FIG. 1, in accordance with alternative embodiments.
Figure 6B:
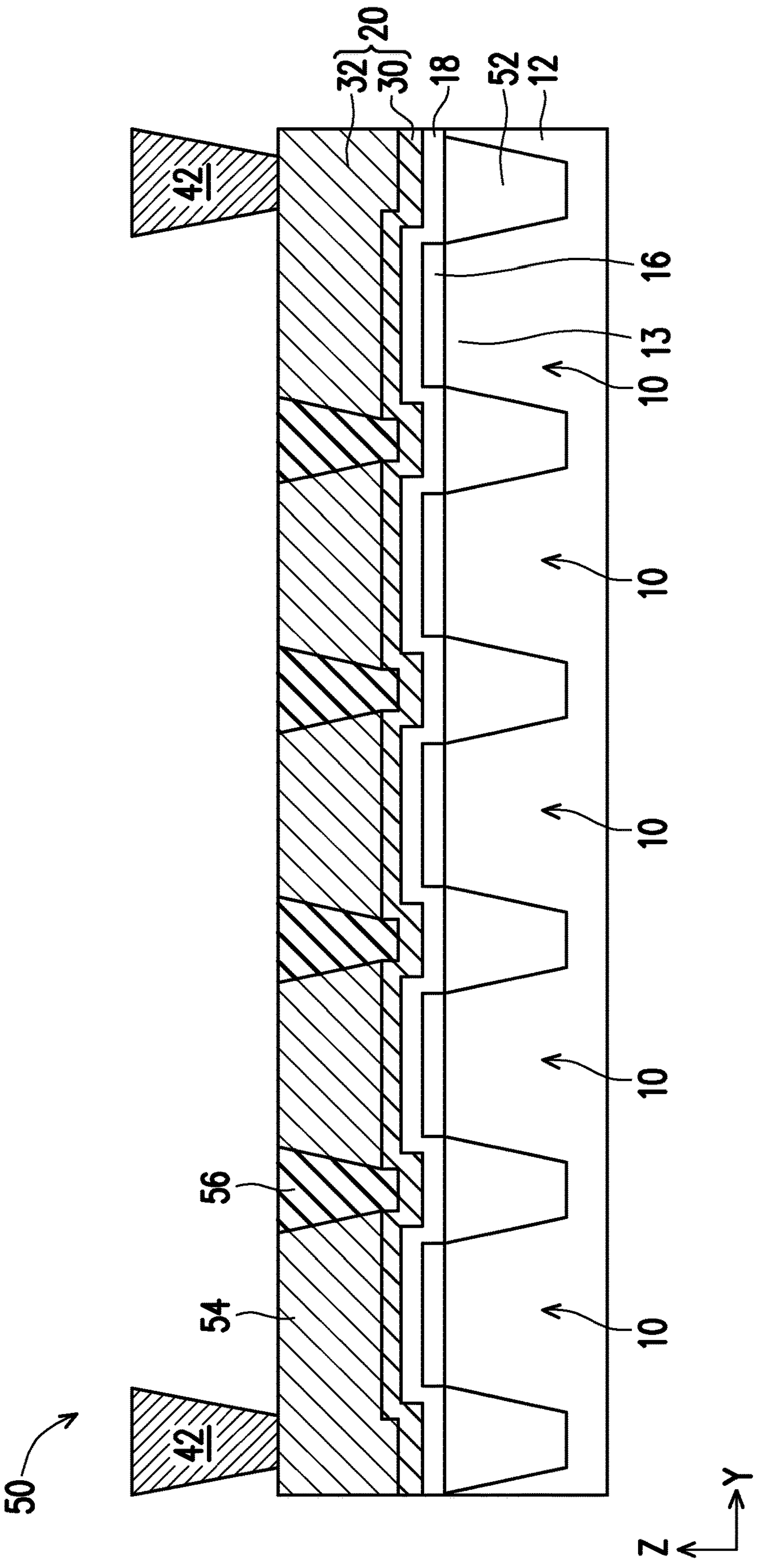

The shape of the gate electrode 20 shown in FIGS. 4A, 4B, and 5 may be used to increase heat generation in (portions of) the gate electrode 20 by creating portions having smaller dimensions. In some embodiments, the materials of the gate electrode 20 may be used to increase heat generation in the gate electrode 20. FIGS. 6A and 6B are various views of the row 50 of the FeFETs 10 of FIG. 1, in accordance with alternative embodiments. As shown in FIG. 6A, which is a top view of the row 50 with various components omitted for clarity, the gate electrode 20 includes alternating first and second portions 54, 56, and the first and second portions 54, 56 are made of or include different materials. In some embodiments, the materials of the first and second portions 54, 56 may be electrically conductive but have different electrical resistivity. For example, the first portion 54 includes the first material having a first electrical resistivity, and the second portion 56 includes a second material having a second electrical resistivity different from the first electrical resistivity. The second electrical resistivity may be substantially greater than or substantially less than the first electrical resistivity. The first and second portions 54, 56 may each include a metal, such as W, Cu, Ti, Al, Co, or other suitable metal. In some embodiments, the first and second portions 54, 56 have the same length along the x direction, as shown in FIG. 6A. However, the length of the first and second portions 54, 56 may be different, such as the gate electrode 20 shown in FIGS. 4A and 4B.

FIG. 6B is a cross-sectional side view of the row 50 of FIG. 6A taken along cross-section B-B. As shown in FIG. 6B, the gate electrode 20 may be formed by first forming the bulk layer 32 followed by forming a plurality of openings in the bulk layer 32. The second portions 56 are then formed in the openings. In some embodiments, the one or more work function layers 30 may function as an etch stop layer during the formation of the openings, and the second portions 56 are formed on the one or more work function layers 30. In some embodiments, portions of the one or more work function layers 30 are removed during the formation of the openings, and the second portions 56 may be formed on the ferroelectric layer 18. In some embodiments, portions of the ferroelectric layer 18 are removed during the formation of the openings, and the second portions 56 are formed on the interfacial layer 16 or the isolation layer 52. In some embodiments, portions of the interfacial layer 16 or the isolation layer 52 are removed during the formation of the openings, and the second portions 56 extend through the gate electrode 20, the ferroelectric layer 18, the interfacial layer 16 (if formed on the isolation layer 52), and into the isolation layer 52. In some embodiments, the top surfaces of the first and second portions 54, 56 are coplanar, as shown in FIG. 6B. In some embodiments, the top surfaces of the first and second portions 54, 56 are non-coplanar, in order to further tuning the electrical resistance of the first and second portions 54, 56.

Figure 7:
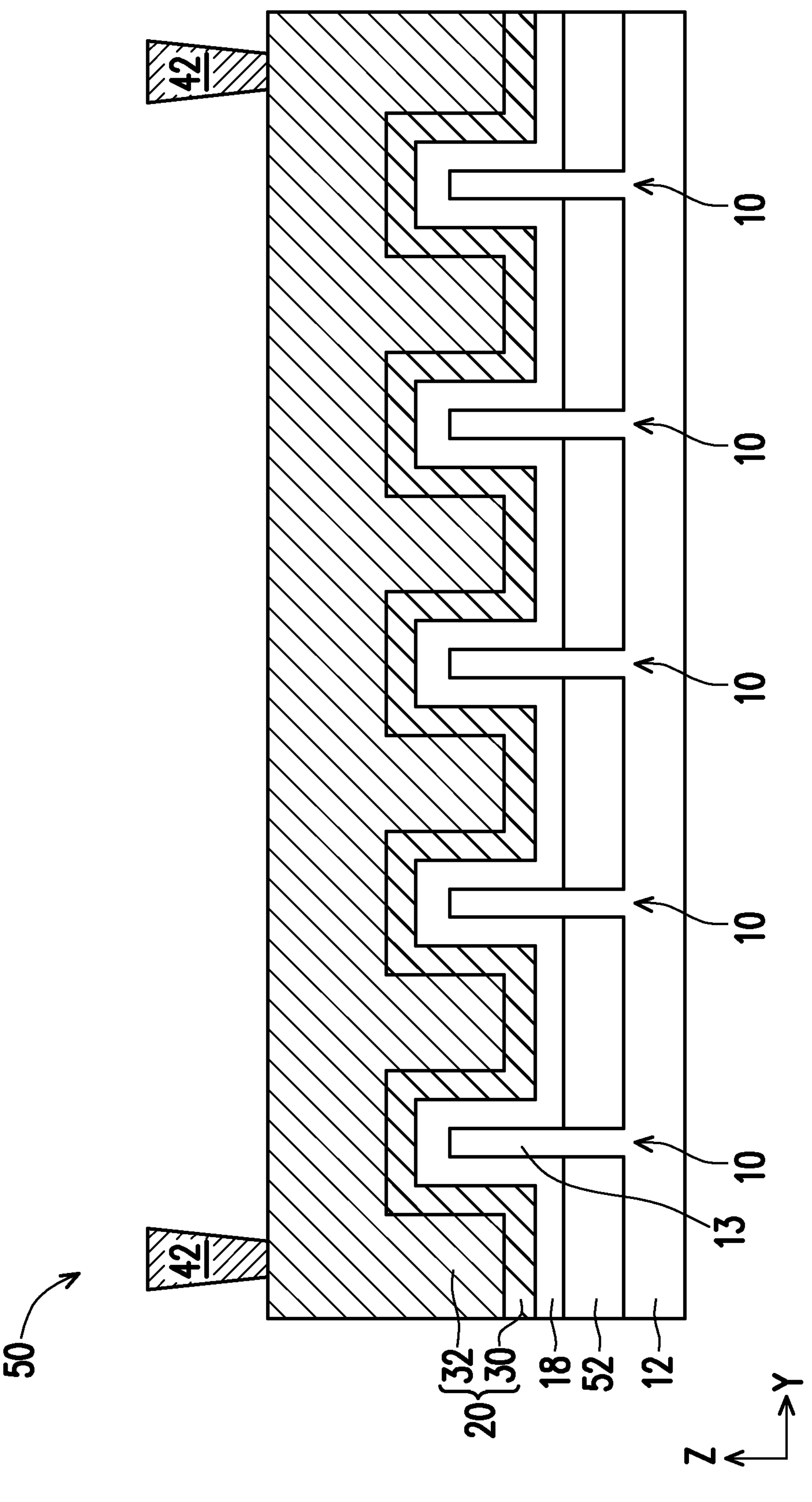
FIG. 7 is a cross-sectional side view of the row of the ferroelectric field effect transistors, in accordance with alternative embodiments.

The FeFET 10 described in previous figures may be a planar FET. The planar FET may be formed using a gate-first process. However, the FeFET 10 may be formed with a gate-last process, and the ferroelectric layer 18 and the one or more work function layers 30 may have a U shape in the x-z plane. The FeFET 10 is not limited to planar FET, and the FeFET 10 may be any suitable type of FET, such as a non-planar FET. In some embodiments, the FeFET 10 is a fin field effect transistor (FinFET). FIG. 7 is a cross-sectional side view of the row 50 of the FeFETs 10, in accordance with alternative embodiments. The interfacial layer 16 is omitted for clarity. In some embodiments, as shown in FIG. 7, the FeFETs 10 are FinFETs. For example, the channel region 13 of each FeFET 10 is a fin that is surrounded on three sides by the gate electrode 20. The ferroelectric layer 18 may also surround three sides of the channel region 13. The isolation layer 52 may be disposed between adjacent channel regions 13.

Figure 8:
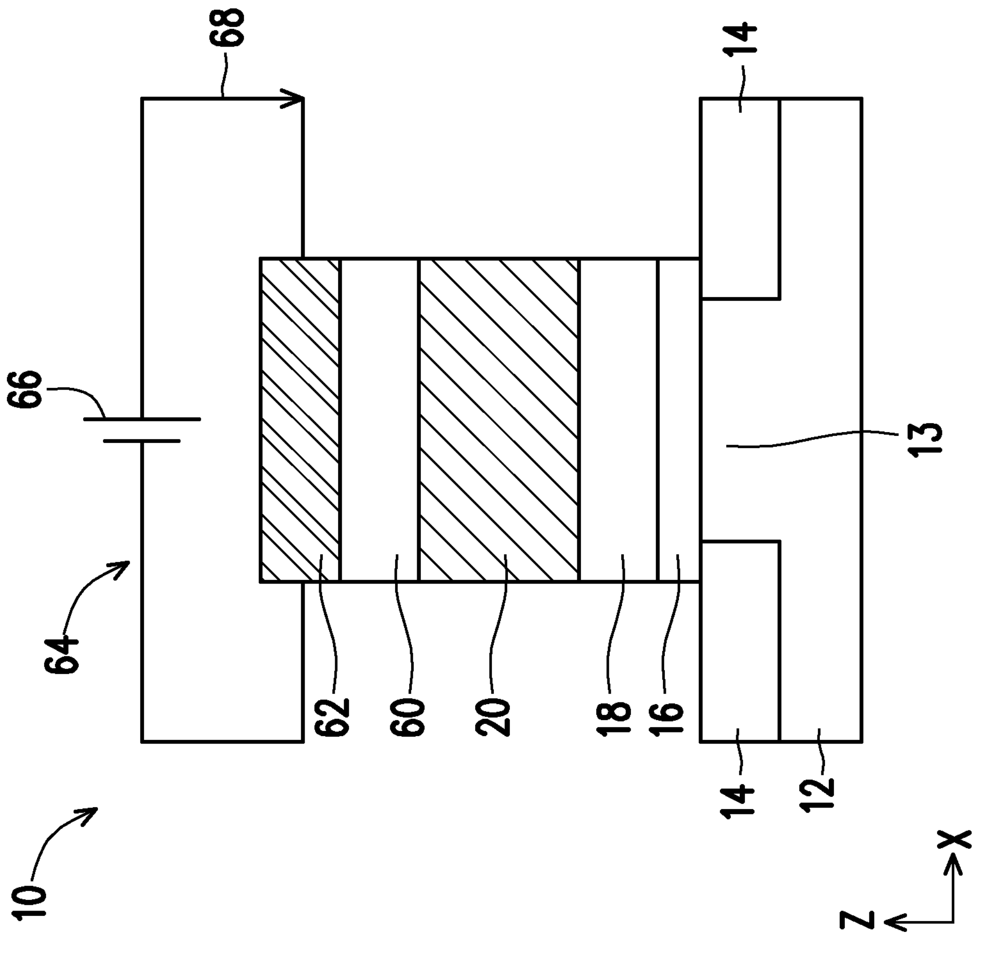
FIG. 8 is a cross-sectional side view of the ferroelectric field effect transistor, in accordance with alternative embodiments.

The gate electrode 20 is heated to an elevated temperature prior to write operation of the FeFET 10, in order to increase the temperature of the ferroelectric layer 18 to reduce the potential barrier between the two polarization states of the ferroelectric layer 18. In some embodiments, the gate electrode 20 is heated during write operation of the FeFET 10. FIG. 8 is a cross-sectional side view of the FeFET 10, in accordance with alternative embodiments. As shown in FIG. 8, the FeFET 10 includes the substrate 12, the S/D regions 14, the channel region 13, the interfacial layer 16, the ferroelectric layer 18, and the gate electrode 20. In some embodiments, the FeFET 10 further includes a dielectric layer 60 and a conductive layer 62. The conductive layer 62 is part of a heater circuit 64. The heater circuit 64 includes a voltage source 66 electrically connected to the conductive layer 62. The voltage source 66 may be distinct from the voltage source for applying a write voltage to the gate electrode 20 to cause the polarization of the ferroelectric layer 18 to switch. In some embodiments, two conductive contacts 42 (FIG. 12A) are disposed on the conductive layer 62, and the voltage source 66 generates a potential difference across the two conductive contacts. As a result, a current 68 flows through the conductive layer 62 and generates heat by Joule heating in the conductive layer 62 due to the electrical resistance of the conductive layer 62. The heat is then transferred to the dielectric layer 60, which is then transferred to the gate electrode 20, and ultimately transferred to the ferroelectric layer 18. Similar to the heater circuit 22, the purpose of the heater circuit 64 is to increase the temperature of the ferroelectric layer 18, such as to increase the temperature of the ferroelectric layer 18 by about 10 degrees Celsius to about 99 degrees Celsius. The conductive layer 62 may be heated during the write operation of the FeFET 10.

The conductive layer 62 includes an electrically conductive material, such as a metal or metal nitride. The material of the conductive layer 62 has a relatively high electrical resistance. In some embodiments, the conductive layer 62 includes Ti, TiAl, TiN, or Pt. The dielectric layer 60 electrically isolates the gate electrode 20 from the conductive layer 62. The dielectric layer 60 may be any suitable dielectric material. In some embodiments, the dielectric layer 60 has good thermal conductivity, so heat can be transferred from the conductive layer 62 to the gate electrode 20. In some embodiments, the dielectric layer 60 includes SiC, SiN, SiON, AlN, Beryllium Oxide, or other suitable dielectric material. In some embodiments, the dielectric layer 60 includes the same material as the gate spacers 34 (FIG. 2A). In some embodiments, the dielectric layer 60 is a carbon-based material, such as diamond like carbon (DLC) or graphite.

Figure 9A:
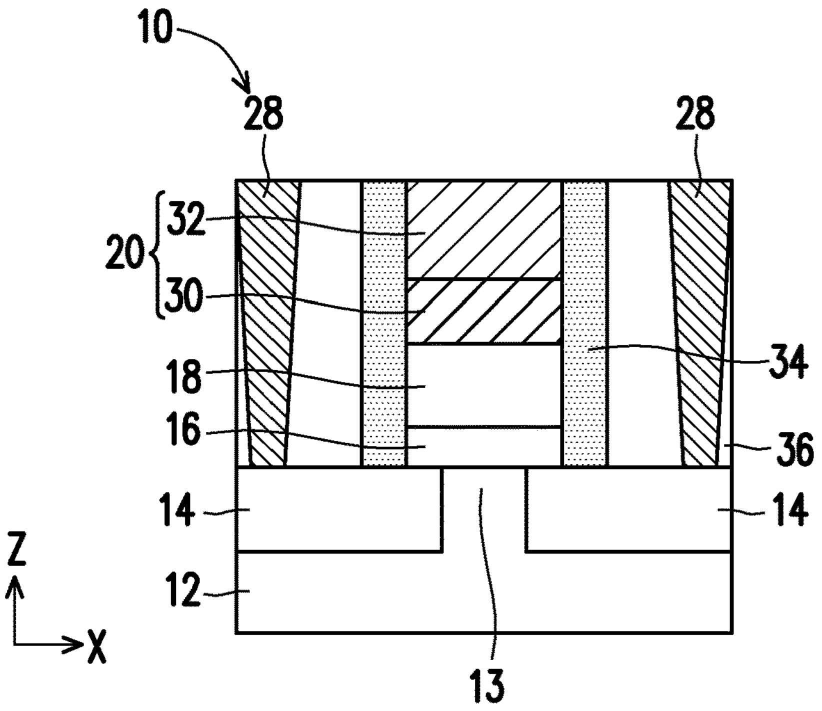
FIGS. 9A-9F are cross-sectional side views of various stages of manufacturing the ferroelectric field effect transistor of FIG. 8, in accordance with some embodiments.
Figure 9B:
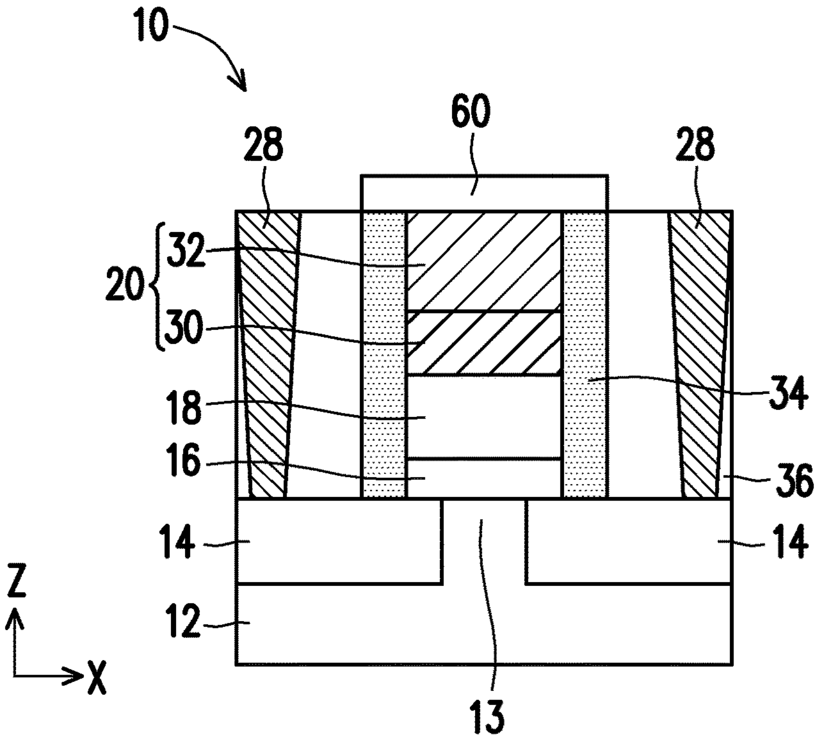

FIGS. 9A-9F are cross-sectional side views of various stages of manufacturing the FeFET 10 of FIG. 8, in accordance with some embodiments. As shown in FIG. 9A, the FeFET 10 may include the same components as the FeFET 10 shown in FIG. 2A. Next, as shown in FIG. 9B, the dielectric layer 60 is formed on the gate electrode 20. The dielectric layer 60 may be formed by first forming a blanket layer and then pattern the blanket layer using a mask (not shown). In some embodiments, the dielectric layer 60 is also formed on the gate spacers 34.

Figure 9C:
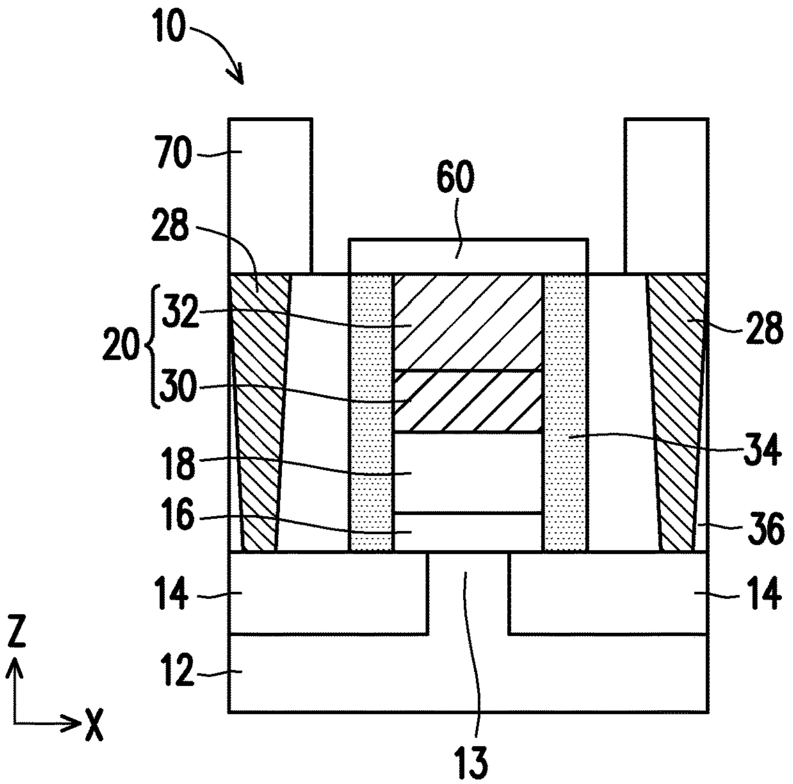
Figure 9D:
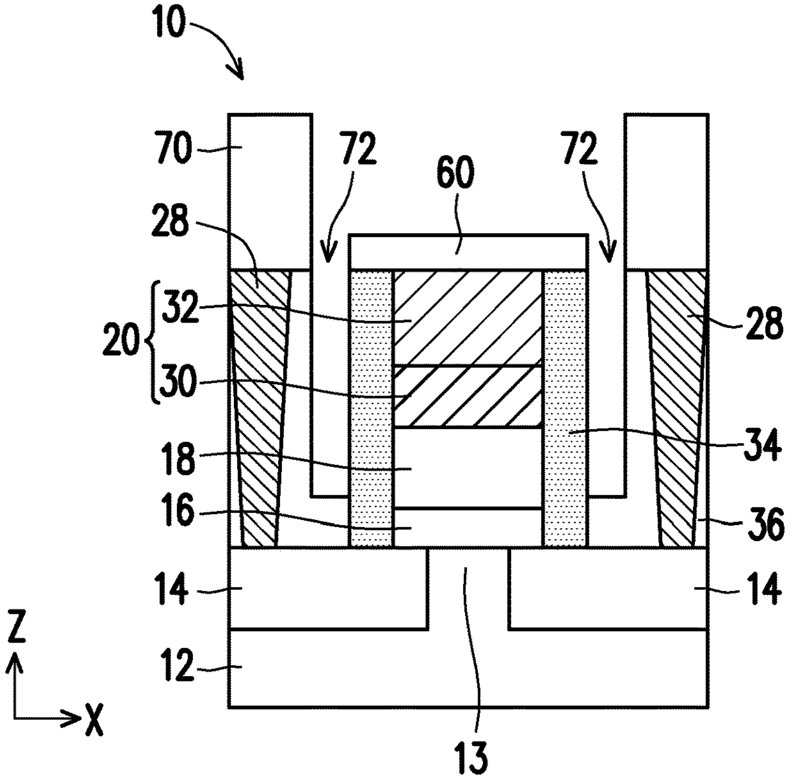

As shown in FIG. 9C, a patterned mask 70 is formed on the ILD 36. The patterned mask 70 may be a photoresist layer. The dielectric layer 60 and portions of the ILD 36 adjacent to the gate spacers 34 are exposed. The patterned mask 70 covers the conductive contacts 28. Next, as shown in FIG. 9D, the exposed portions of the ILD 36 are recessed. The recess of the exposed portions of the ILD 36 may be performed by any suitable process, such as a dry etch, a wet etch, or a combination thereof. In some embodiments, an anisotropic dry etch process is performed to recess the exposed portions of the ILD 36. The dry etch process may be a selective process that does not substantially affect the dielectric layer 60 and the gate spacers 34. Openings 72 are formed in the ILD 36 adjacent the gate spacers 34. A portion of the ILD 36 remains between each conductive contact 28 and the corresponding opening 72 in order to electrically isolate the conductive contact 28 and the conductive layer 62 subsequently formed in the opening 72. The bottom of the opening 72 may be located at a level between the top and bottom surfaces of the ferroelectric layer 18. If the bottom of the opening 72 is located at a level below the bottom surface of the ferroelectric layer 18, the risk of having the conductive layer 62 contacting the S/D region 14 is increased. On the other hand, if the bottom of the opening 72 is located at a level above the top surface of the ferroelectric layer 18, heating of the ferroelectric layer 18 from the sides may not be achieved.

Figure 9E:
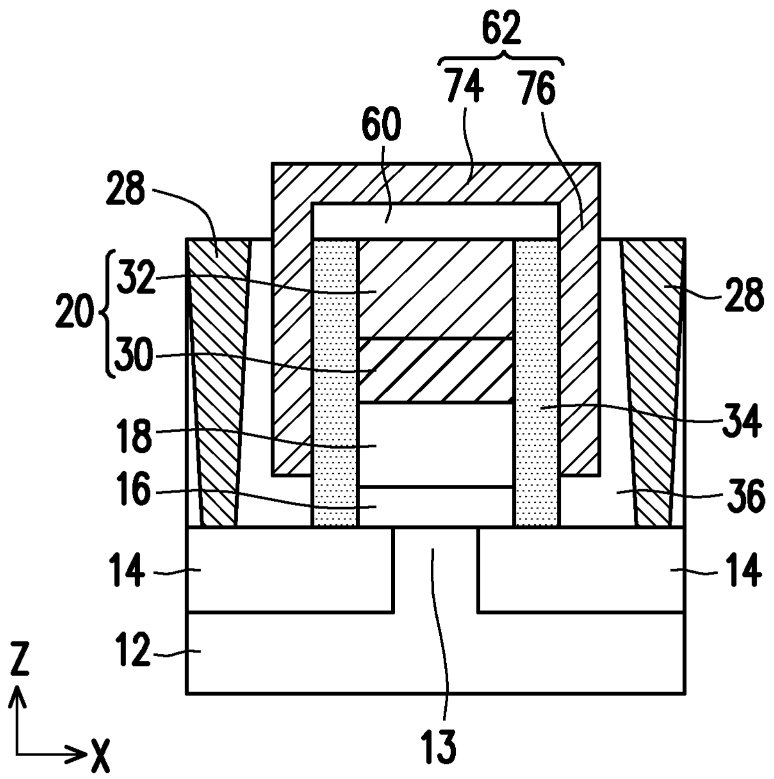

As shown in FIG. 9E, the conductive layer 62 is formed in the openings 72 and on the dielectric layer 60. The conductive layer 62 includes a top portion 74 and side portions 76. The conductive layer 62 may be formed by any suitable process, such as PVD or ALD. In some embodiments, the conductive layer 62 is a conformal layer formed by ALD. In some embodiments, the conductive layer 62 is formed by PVD, and the thickness of the top portion 74 along the z direction may be substantially greater than the thickness of the side portion 76 along the x direction. The conductive layer 62 may be also formed on the patterned mask 70, and a planarization process, such as a chemical-mechanical polishing (CMP) process, may be performed to remove the portion of the conductive layer 62 formed on the patterned mask 70 to expose the patterned mask 70. Then, the patterned mask 70 is removed by a selective process that does not substantially affect the conductive layer 62, the ILD 36, and the conductive contacts 28. In some embodiments, as shown in FIG. 9E, the conductive layer 62 covers three sides of the gate electrode 20. For example, the top portion 74 covers the top of the gate electrode 20, and the side portions 76 cover the sides of the gate electrode 20. At least a portion of each side of the ferroelectric layer 18 may be also covered by the conductive layer 62. Improved heating of the ferroelectric layer 18 may be achieved with the conductive layer 62 having the top portion 74 and the side portions 76.

Figure 9F:
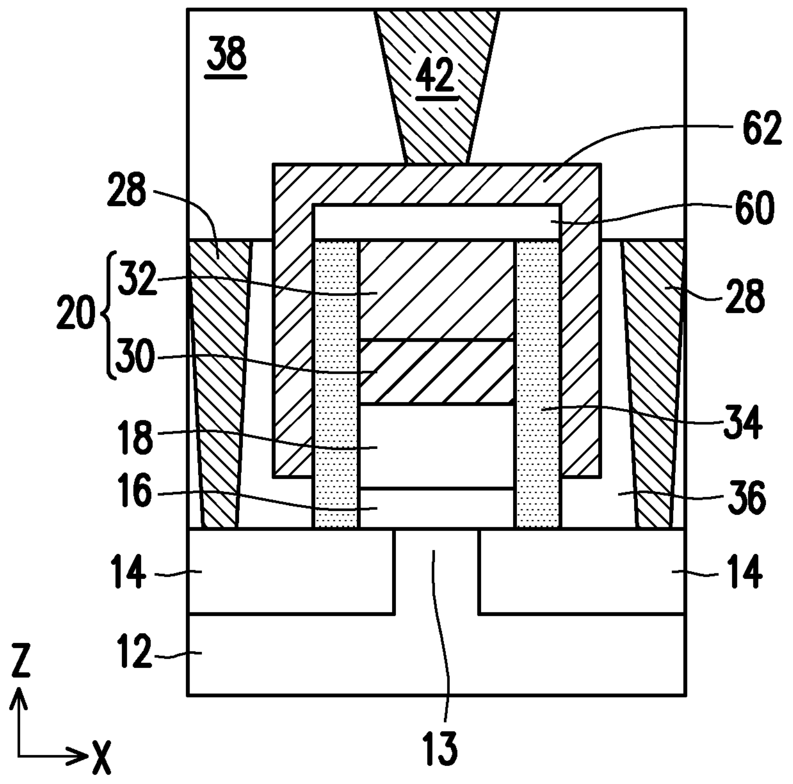

As shown in FIG. 9F, the dielectric material 38 is formed on the conductive layer 62, the conductive contacts 28, and the ILD 36, and the two conductive contacts 42 (of which one is shown) are formed in the dielectric material 38 and in contact with the conductive layer 62.

Figure 10A:
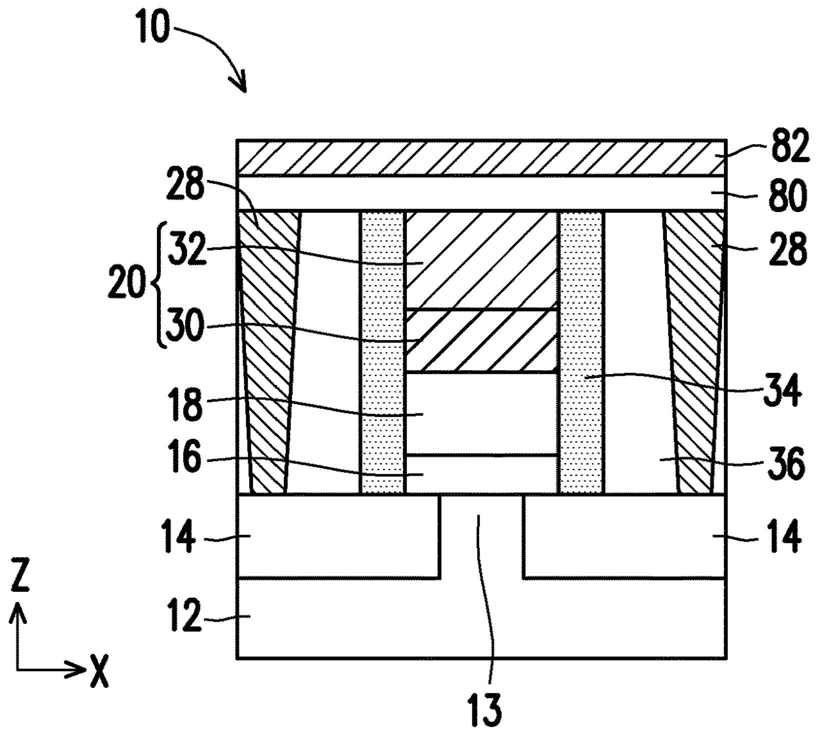
FIGS. 10A-10E are cross-sectional side views of various stages of manufacturing the ferroelectric field effect transistor of FIG. 8, in accordance with alternative embodiments.

FIGS. 10A-10E are cross-sectional side views of various stages of manufacturing the FeFET 10 of FIG. 8, in accordance with alternative embodiments. As shown in FIG. 10A, a dielectric layer 80 is formed on the ILD 36, the conductive contacts 28, the gate spacers 34, and the gate electrode 20. The dielectric layer 80 may include the same material as the dielectric layer 60. A conductive layer 82 is formed on the dielectric layer 80, and the conductive layer 82 may include the same material as the conductive layer 62. The dielectric layer 80 and the conductive layer 82 may be formed by any suitable process, such as CVD, PVD, or ALD.

Figure 10B:
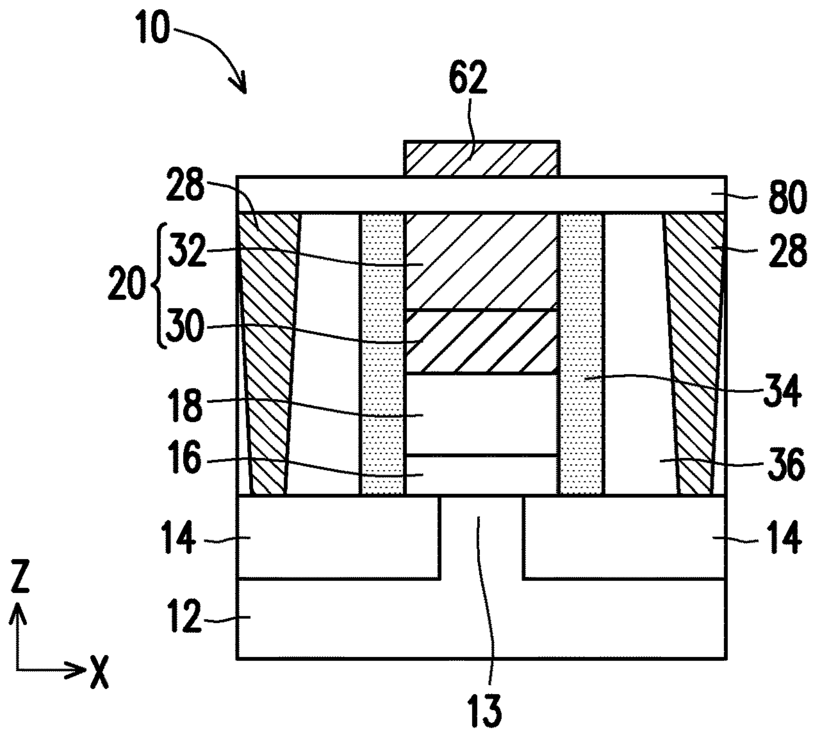
Figure 10C:
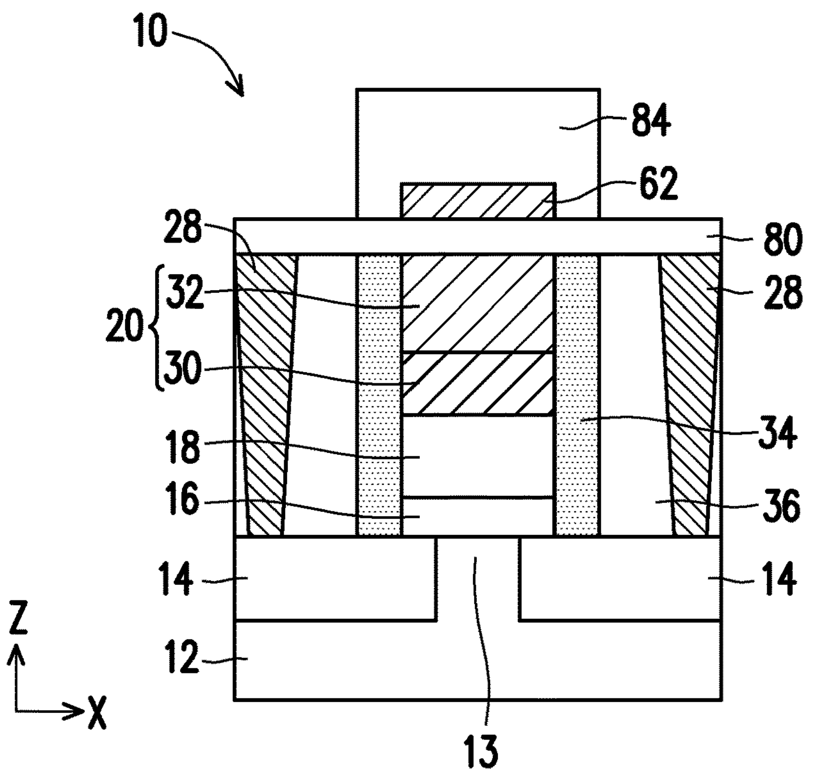
Figure 10D:
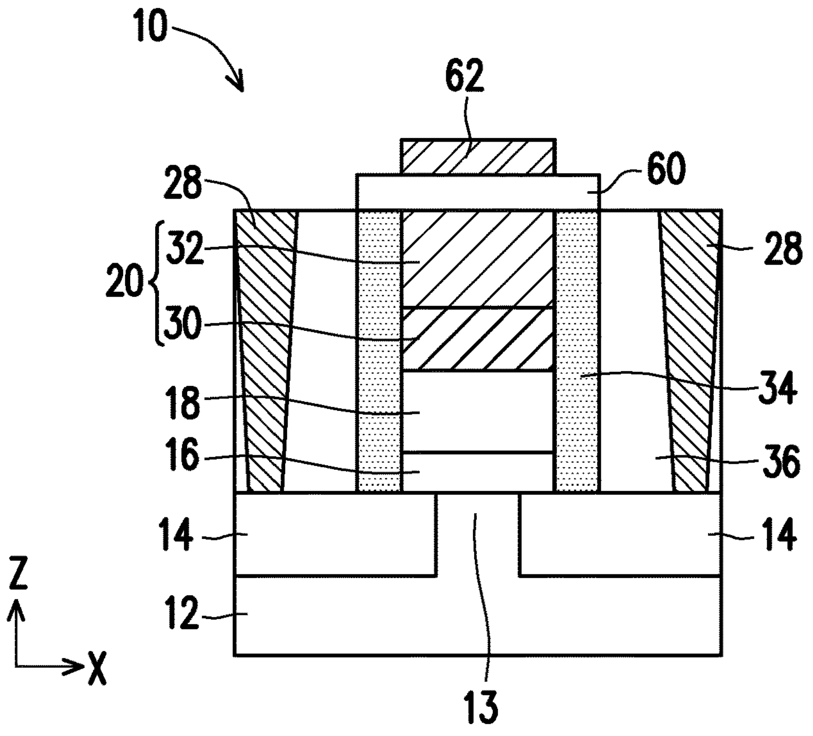

Next, as shown in FIG. 10B, the conductive layer 82 is patterned to form the conductive layer 62. The conductive layer 82 may be patterned by any suitable process. In some embodiments, a patterned mask (not shown) is formed on a portion of the conductive layer 82, and the exposed portion of the conductive layer 82 is removed by any suitable process, such as a dry etch, a wet etch, or a combination thereof. In some embodiments, the conductive layer 62 has a length along the x direction substantially the same as a length of the gate electrode 20. Portions of the dielectric layer 80 are exposed as the result of patterning the conductive layer 82. Next, as shown in FIG. 10C, a patterned mask 84 is formed on the conductive layer 62 and a portion of the dielectric layer 80, and a portion of the dielectric layer is exposed. The patterned mask 84 may include any suitable material. In some embodiments, the patterned mask 84 is a photoresist layer. As shown in FIG. 10D, the exposed portion of the dielectric layer 80 is removed to form the dielectric layer 60. The removal of the exposed portion of the dielectric layer 80 may be performed by any suitable method, such as a dry etch, a wet etch, or a combination thereof. In some embodiments, the dielectric layer 60 has a length along the x direction that is substantially greater than the length of the conductive layer 62.

Figure 10E:
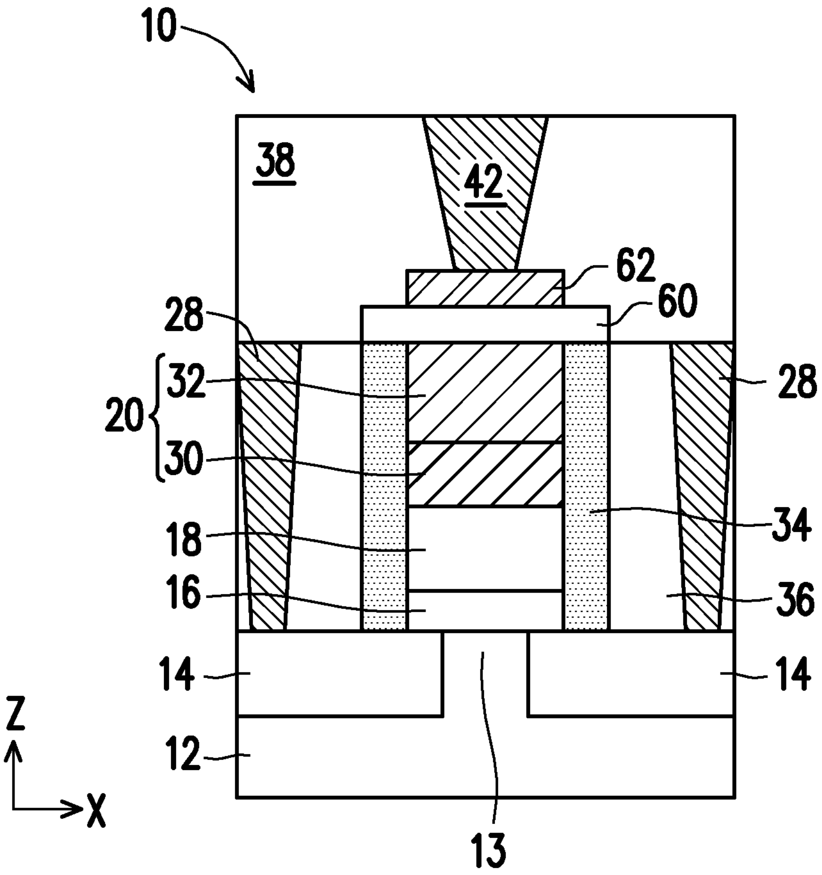

As shown in FIG. 10E, the dielectric material 38 is formed on the conductive layer 62, the dielectric layer 60, the conductive contacts 28, and the ILD 36, and the two conductive contacts 42 (of which one is shown) are formed in the dielectric material 38 and in contact with the conductive layer 62.

Figure 11A:
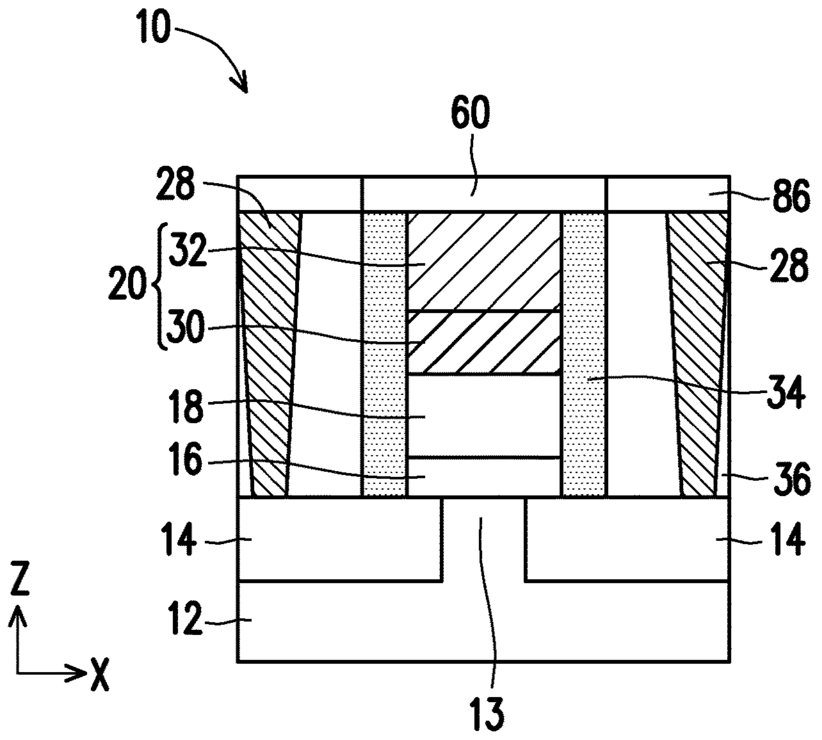
FIGS. 11A-11C are cross-sectional side views of various stages of manufacturing the ferroelectric field effect transistor of FIG. 8, in accordance with alternative embodiments.
Figure 11B:
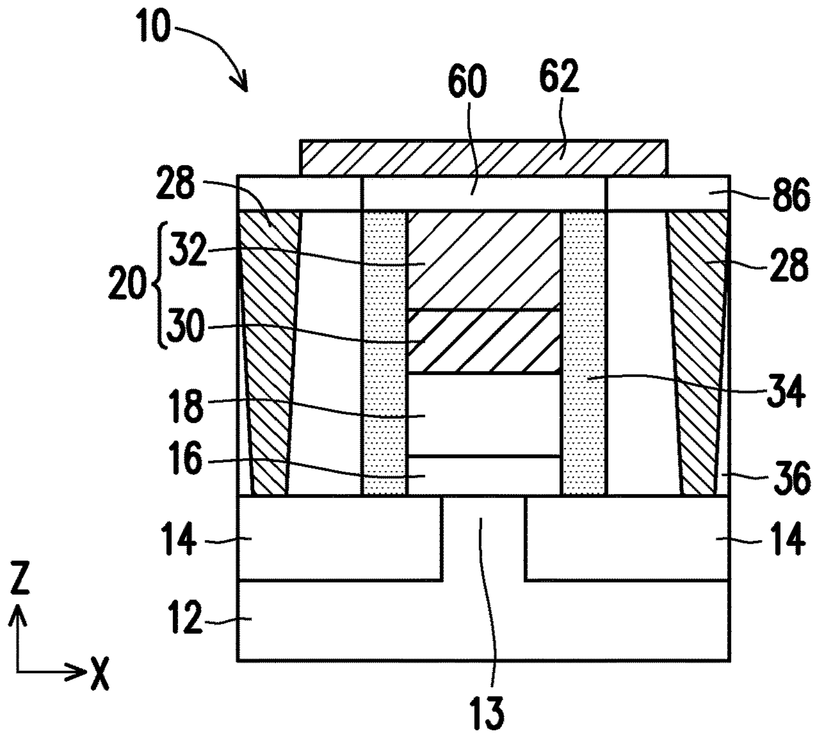
Figure 11C:
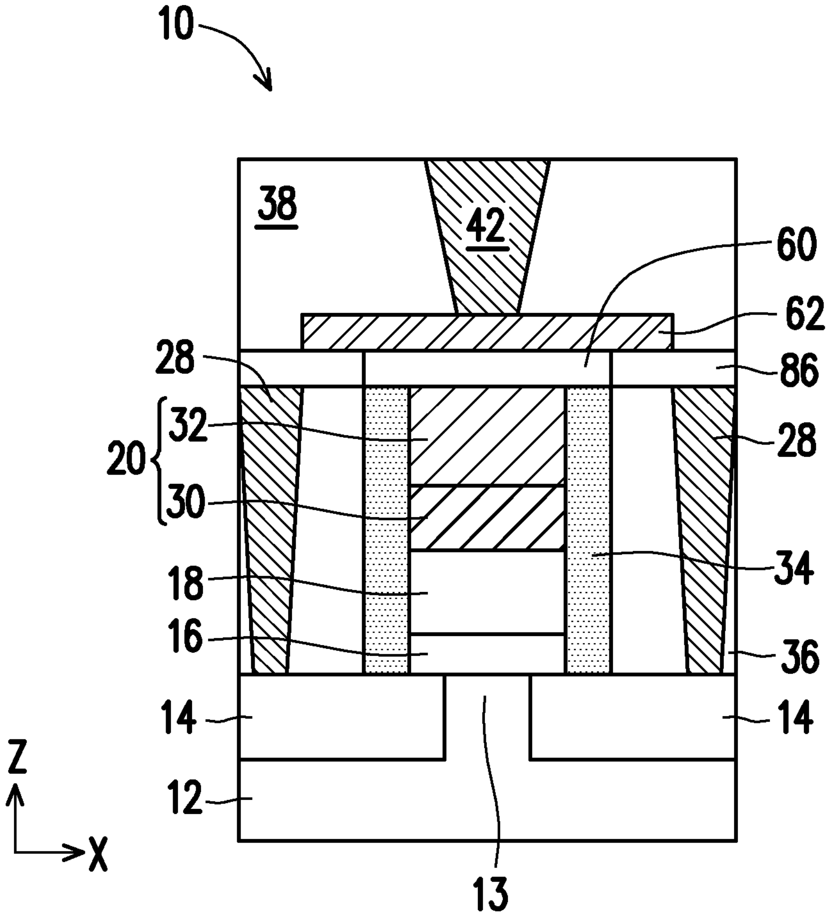

FIGS. 11A-11C are cross-sectional side views of various stages of manufacturing the FeFET 10 of FIG. 8, in accordance with alternative embodiments. As shown in FIG. 11A, a dielectric layer 86 is formed on the ILD 36, the conductive contacts 28, the gate spacers 34, and the gate electrode 20. The dielectric layer 86 may include the same material as the ILD 36. The dielectric layer 60 is formed in the dielectric layer 86. In some embodiments, an opening is formed in the dielectric layer 86, and the dielectric layer 60 is formed in the opening. In some embodiments, a blanket dielectric layer, such as the dielectric layer 80 (FIG. 10A) is formed on the ILD 36, the conductive contacts 28, the gate spacers 34, and the gate electrode 20, followed by removing portions of the dielectric layer to form the dielectric layer 60, and then the dielectric layer 86 is formed. By forming the dielectric layer 60 before forming the dielectric layer 86, the gate electrode 20 is protected from etch processes.

Next, as shown in FIG. 11B, the conductive layer 62 is formed on the dielectric layer 60 and a portion of the dielectric layer 86. In some embodiments, a blanket conductive layer, such as the conductive layer 82 (FIG. 10A), is formed on the dielectric layer 86 and the dielectric layer 60, and the conductive layer is patterned to form the conductive layer 62. The conductive layer may be patterned by any suitable process. In some embodiments, a patterned mask (not shown) is formed on a portion of the conductive layer, and the exposed portion of the conductive layer is removed by any suitable process, such as a dry etch, a wet etch, or a combination thereof. In some embodiments, the conductive layer 62 has a length along the x direction substantially the greater than a length of the dielectric layer 60, as shown in FIG. 11B.

As shown in FIG. 11C, the dielectric material 38 is formed on the conductive layer 62 and the dielectric layer 86, and the two conductive contacts 42 (one is shown) are formed in the dielectric material 38 and in contact with the conductive layer 62.

Figure 12A:
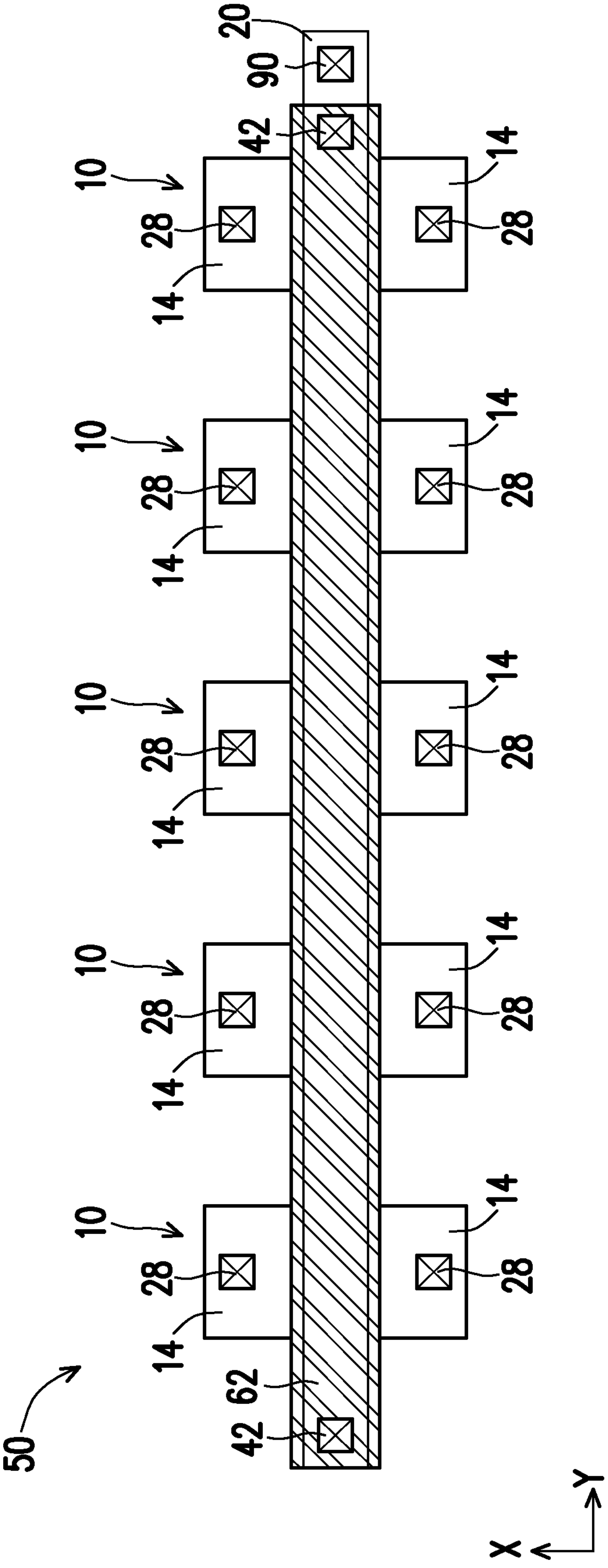
FIGS. 12A-12C are top views of the row of the ferroelectric field effect transistors of FIG. 8, in accordance with some embodiments.
Figure 12B:
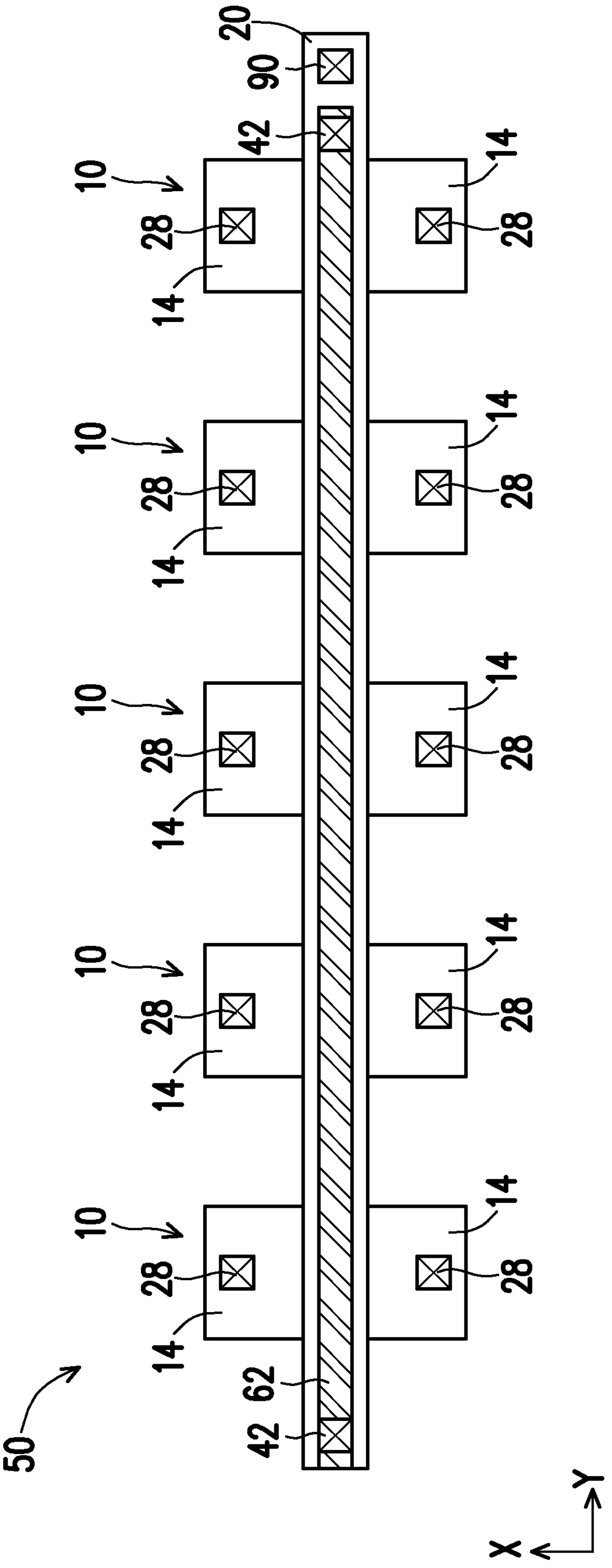
Figure 12C:
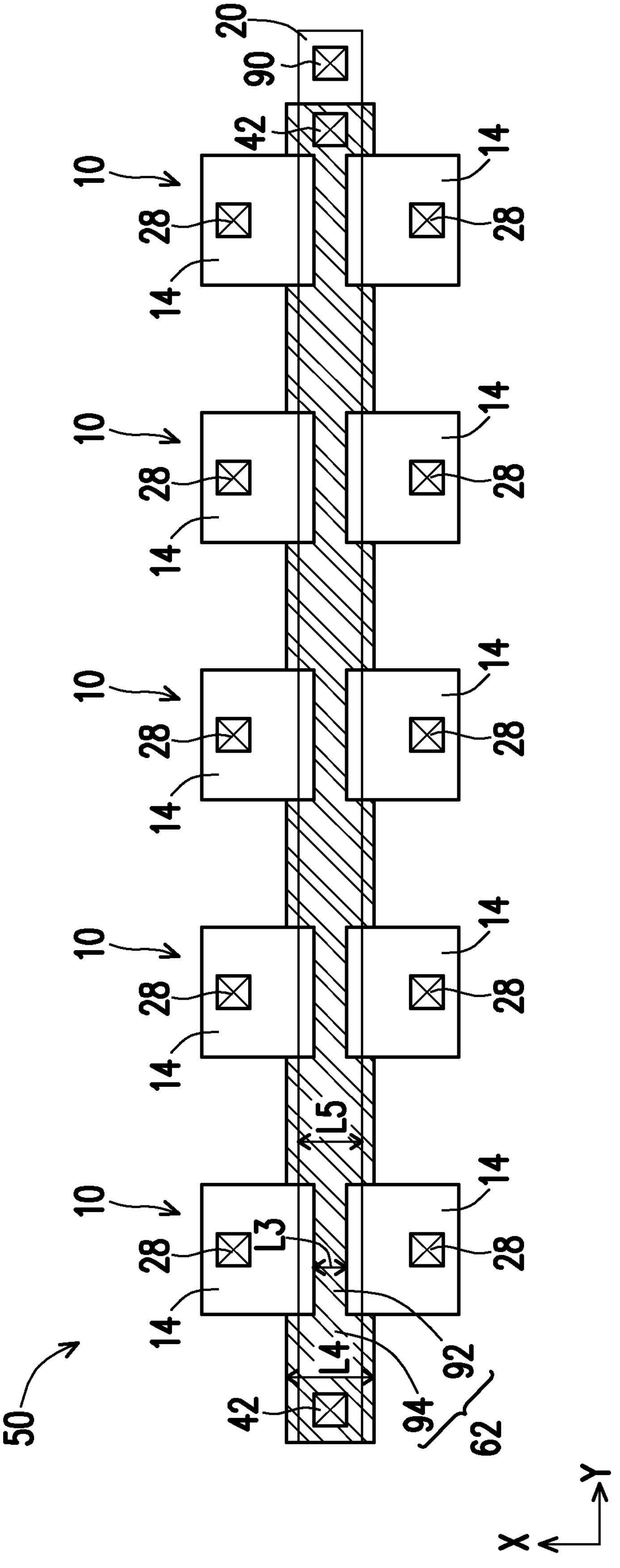

FIGS. 12A-12C are top views of the row 50 of the FeFETs 10 of FIG. 8, in accordance with some embodiments. Some components of the FeFET 10, such as the dielectric material 38, the ILD 36, and the gate spacers 34, may be omitted for clarity in FIGS. 12A to 12C. Furthermore, the components shown in FIGS. 12A to 12C may be located at different levels along the z direction. As shown in FIG. 12A, the row 50 of the FeFETs 10 includes five FeFETs 10. However, the row 50 may include any number of the FeFETs 10. Each FeFET 10 includes the S/D regions 14 and corresponding conductive contacts 28. The five FeFETs 10 share one gate electrode 20, and the conductive layer 62 is disposed over the gate electrode 20. In some embodiments, the conductive layer 62 covers three sides of the gate electrode 20, such as the conductive layer 62 shown in FIG. 9F. In some embodiments, the length in the x direction of the conductive layer 62 is substantially greater than the length in the x direction of the gate electrode 20, such as the conductive layer 62 shown in FIG. 11C. In order to operate the FeFETs 10, a conductive contact 90 is disposed on the gate electrode 20. Thus, a width of the gate electrode 20 along the y direction may be substantially greater than a width of the conductive layer 62, so the conductive contact 90 is electrically isolated from the conductive layer 62. The dielectric material 38 (FIG. 11C) may be disposed between the conductive contact 90 and the conductive layer 62. The dielectric material 38 may be also disposed between the conductive contact 90 and the conductive contact 42. During write operation of the FeFETs 10, a voltage greater than the coercive voltage (or switch voltage) from a first voltage source is applied to the conductive contact 90 to perform write operation, and different voltages from a second voltage source are applied to the conductive contacts 42 to cause a current flow from one of the conductive contacts 42 to the other conductive contact 42 across the conductive layer 62. As a result, the ferroelectric layer 18 is heated by the heat generated from the conductive layer 62 during write operation of the FeFET 10, thereby reducing the potential barrier between the two polarization states, and thereby reducing the coercive field.

Figure 13A:
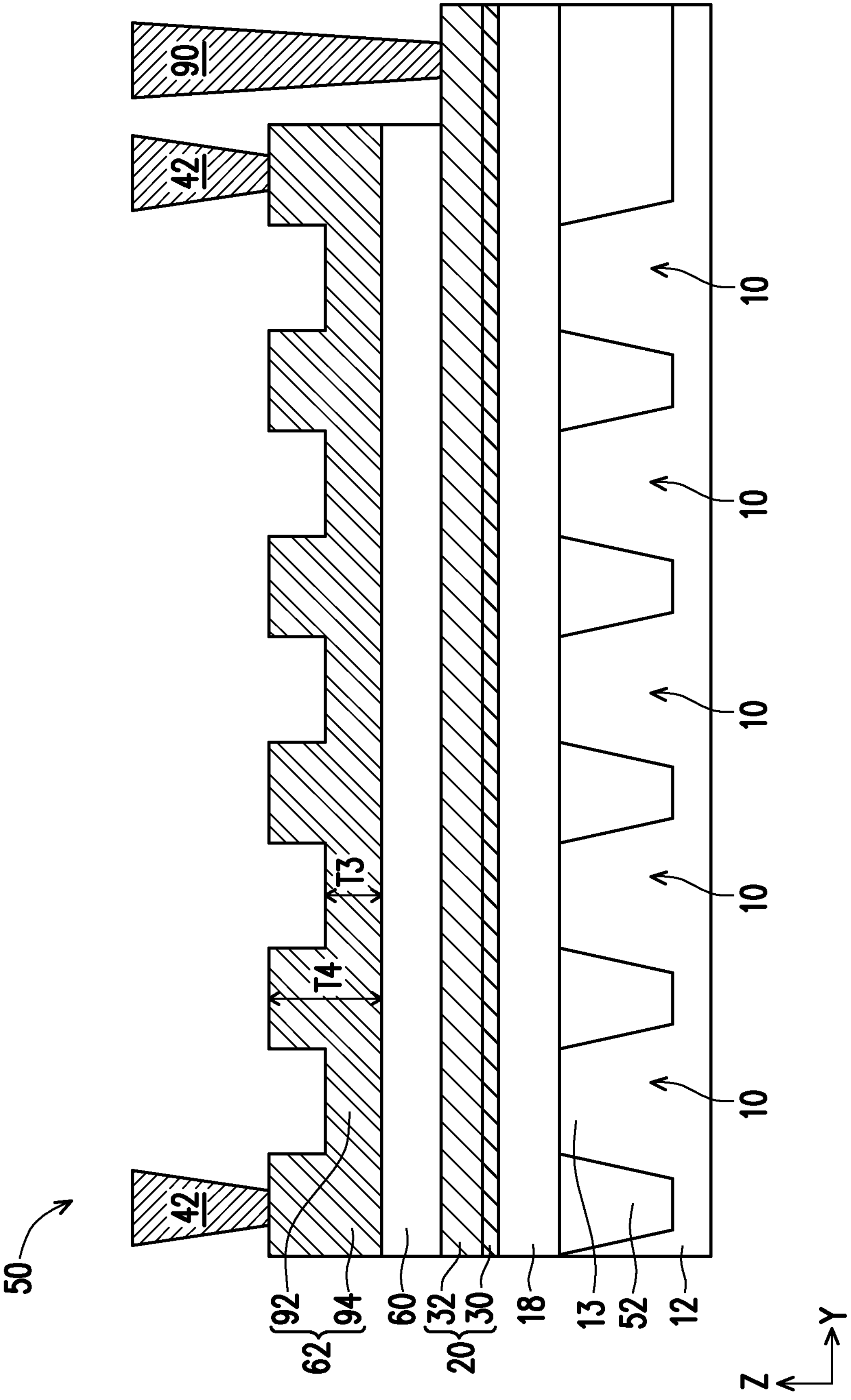
FIGS. 13A-13C are cross-sectional side views of the row of the ferroelectric field effect transistors of FIG. 8, in accordance with some embodiments.

In some embodiments, as shown in FIG. 12B, the length along the x direction of the conductive layer 62 is substantially less than the length along the x direction of the gate electrode 20. The conductive layer 62 may be the conductive layer 62 shown in FIG. 10E. In some embodiments, as shown in FIG. 12C, the conductive layer 62 includes alternating first and second portions 92, 94. For example, the first portions 92 may be disposed over the portions of the gate electrode 20 that are over the channel regions 13 (FIG. 13A), and the second portions 94 may be disposed over the portions of the gate electrode 20 that are over the isolation layer 52 (FIG. 13A). In some embodiments, each first portion 92 has a length L3 and each second portion 94 has a length L4 substantially greater than the length L3. The length L3 may be substantially less than the length L5 of the gate electrode 20, as shown in FIG. 12C, or substantially the same as or greater than the length L5 of the gate electrode 20. The length L4 may be substantially the same as, greater than, or less than the length L5 of the gate electrode 20. Similar to the first portions 54 of the gate electrode 20 shown in FIG. 4B, more heat may be generated in the first portions 92 due to the smaller length L3. As described above, the length L5 of the gate electrode 20 may be fixed by device specification. However, the length L3 of the first portions 92 are not limited by device specification and can be smaller than the length L5 of the gate electrode 20. The conductive layer 62 having the first and second portions 92, 94 may be formed by using a patterned mask (not shown). In some embodiments, the dielectric layer 60 may have the same pattern as the conductive layer 62. In some embodiments, the first portions 92 and the second portions 94 include different materials, which may be similar to the first and second portions 54, 56 of the gate electrode 20 shown in FIGS. 6A and 6B.

Figure 13B:
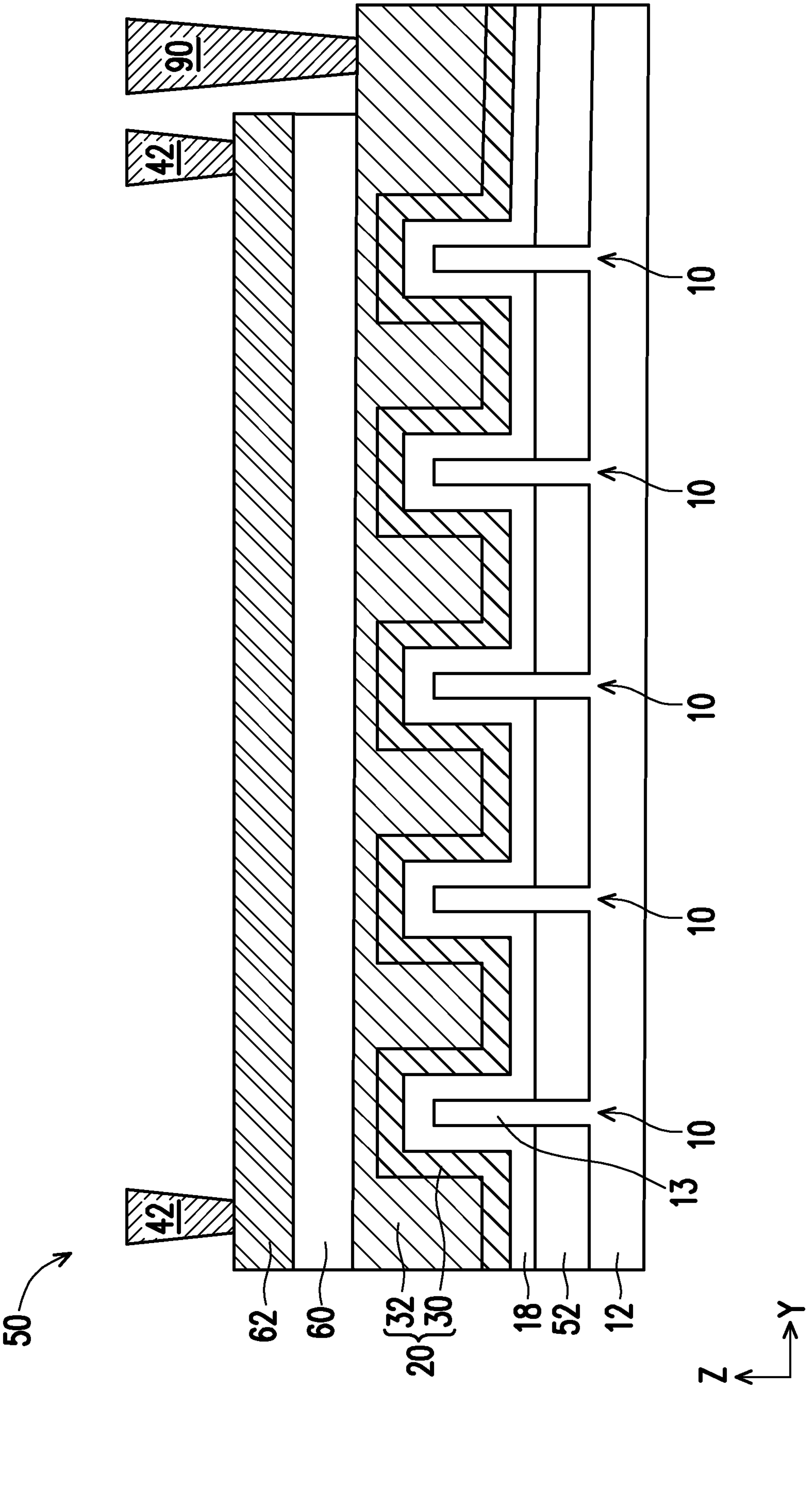
Figure 13C:
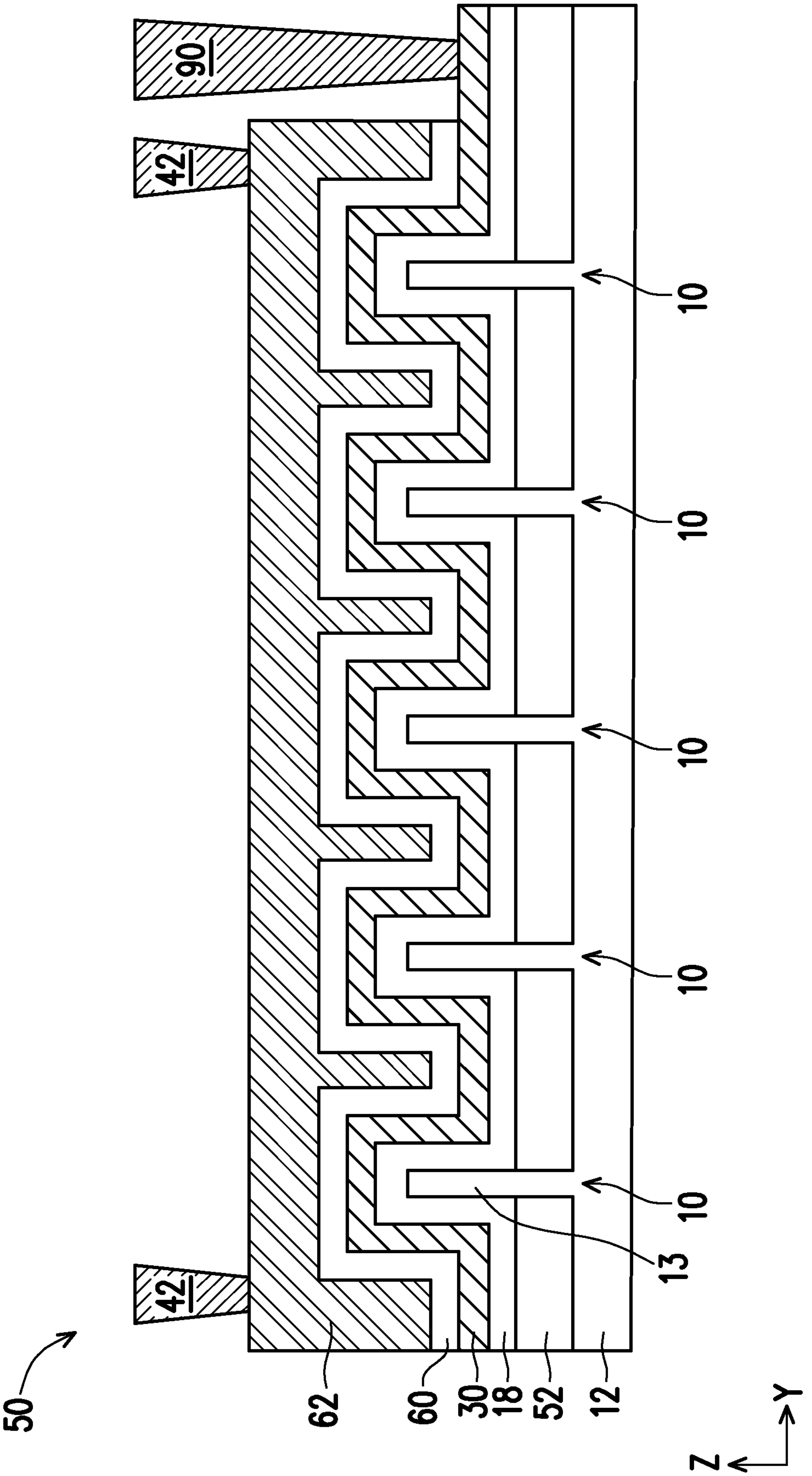

FIGS. 13A-13C are cross-sectional side views of the row 50 of the FeFETs 10 of FIG. 8, in accordance with some embodiments. The dielectric material 38 is omitted in FIGS. 13A to 13C for clarity. Instead of varying the length of the conductive layer 62, the thickness of the conductive layer 62 may be varied. In some embodiments, as shown in FIG. 13A, the first portions 92 and the second portions 94 have different thicknesses. In some embodiments, similar to the conductive layer 62 shown in FIG. 12C, the conductive layer 62 includes alternating first and second portions 92, 94. The first portion 92 has a thickness T3 along the z direction, and the second portion 94 has a thickness T4 different from the thickness T3. In some embodiments, the thickness T3 is substantially less than the thickness T4, as shown in FIG. 13A. As a result, more heat is generated in the active regions due to the smaller thickness T3. In some embodiments, the thickness T3 is substantially greater than the thickness T4. In some embodiments, the length of the conductive layer 62 along the x direction may be constant, such as the conductive layer 62 shown in FIGS. 12A and 12B. In some embodiments, both the thickness and length of the conductive layer 62 may be varied. For example, the conductive layer 62 may include varying thicknesses T3 and T4 as shown in FIG. 13A and varying lengths L13 and L4 as shown in FIG. 12C.

FIG. 13B is a cross-sectional side view of the row 50 of the FeFETs 10, in accordance with alternative embodiments. The interfacial layer 16 is omitted for clarity. In some embodiments, as shown in FIG. 13B, the FeFETs 10 are FinFETs. For example, the channel region 13 of each FeFET 10 is a fin that is surrounded on three sides by the gate electrode 20. The ferroelectric layer 18 may also surround three sides of the channel region 13. The isolation layer 52 may be disposed between adjacent channel regions 13.

FIG. 13C is a cross-sectional side view of the row 50 of the FeFETs 10, in accordance with alternative embodiments. The interfacial layer 16 is omitted for clarity. In some embodiments, as shown in FIG. 13C, the FeFETs 10 are FinFETs, and the bulk layer 32 is not present in the FeFET 10. In some embodiments, the dielectric layer 60 is a conformal layer and is formed on the one or more work function layers 30, and the conductive layer 62 is formed on the dielectric layer 60. Portions of the dielectric layer 60 and the conductive layer 62 may be located between adjacent fins, or channel regions 13. The conductive contact 90 is formed on the one or more work function layers 30.

Figure 14A:
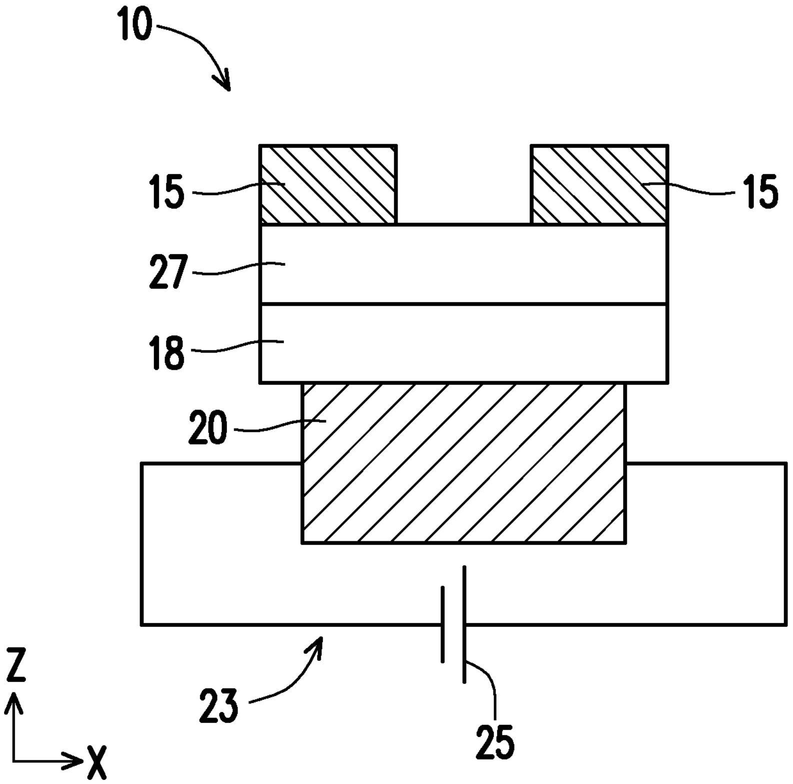
FIGS. 14A and 14B are cross-sectional side views of the ferroelectric field effect transistor, in accordance with alternative embodiments.
Figure 14B:
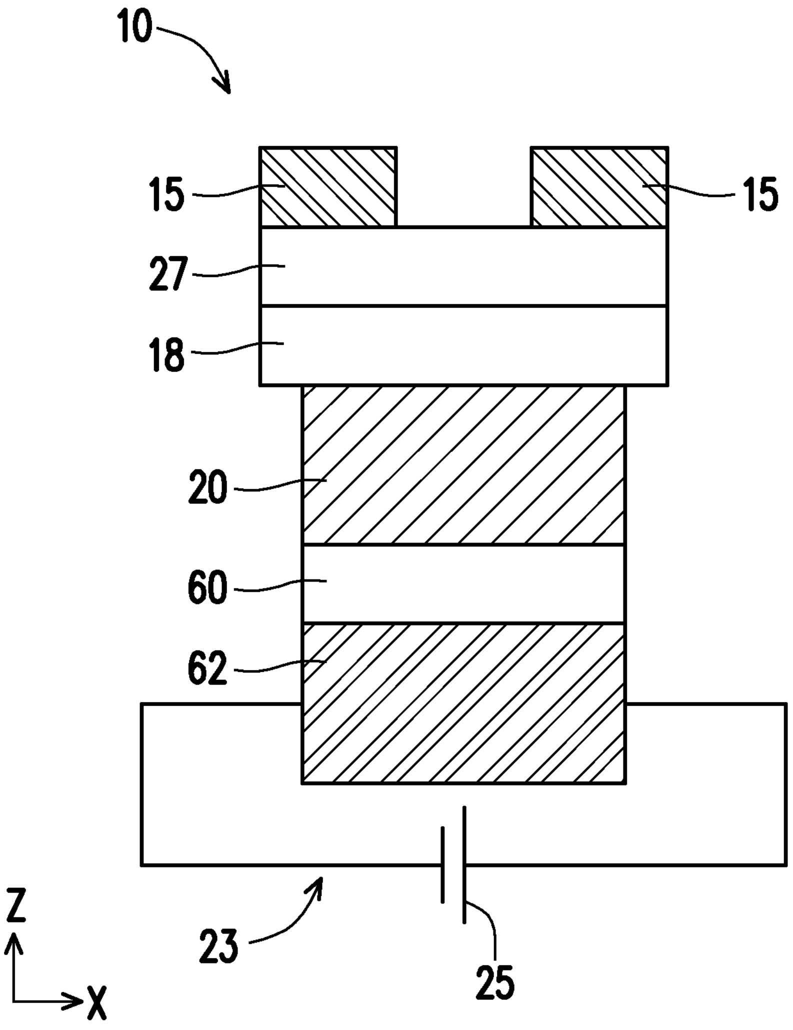

FIGS. 14A and 14B are cross-sectional side views of the FeFET 10, in accordance with alternative embodiments. The FeFET 10 shown in FIGS. 14A and 14B may be a thin film transistor (TFT) that is formed in back-end-of-line (BEOL) processes. The channel region of the TFT may include a semiconductor material similar to the ones of the substrate 12 (FIG. 1), or a metal oxide semiconductor material, such as indium oxide, gallium oxide, indium tin oxide, indium tungsten oxide, indium gallium zinc oxide (IGZO), or other suitable metal oxide semiconductor material. As shown in FIG. 14A, the FeFET 10 includes the gate electrode 20, the ferroelectric layer 18 disposed on the gate electrode 20, a channel layer 27 (or channel region) formed over the ferroelectric layer 18, and S/D regions 15 formed over the channel layer 27. The S/D regions 15 are electrically connected to the channel layer 27. The S/D regions 15 may include an electrically conductive material, such as a metal or metal nitride. In some embodiments, the S/D region 15 includes TiN, TaN, W, or WN. In some embodiments, the S/D region 15 may include a liner (not shown) made of an electrically conductive material. For example, the S/D region 15 may include a liner made of TiN and a bulk layer made of W.

In order to increase the temperature of the ferroelectric layer 18 prior to the write operation of the FeFET 10, the gate electrode 20 is part of a heater circuit 23. The heater circuit 23 includes a voltage source 25 electrically connected to the gate electrode 20. In some embodiments, the gate electrode 20 is disposed on two conductive contacts, such as the conductive contacts 42 shown in FIG. 2D, and the voltage source 25 generates a potential difference across the two conductive contacts. As a result, a current flows through the gate electrode 20 and generates heat by Joule heating in the gate electrode 20 due to the electrical resistance of the gate electrode 20. The heat is then transferred to the ferroelectric layer 18.

FIG. 14B is a cross-sectional side view of the FeFET 10 in accordance with alternative embodiments. As shown in FIG. 14B, the FeFET 10 includes the conductive layer 62, the dielectric layer 60 disposed on the conductive layer 62, the gate electrode 20 disposed on the dielectric layer 60, the ferroelectric layer 18 disposed over the gate electrode 20, the channel layer 27 disposed over the ferroelectric layer 18, and the S/D regions 15 disposed over the channel layer 27. The conductive layer 62 is part of a heater circuit 31. The heater circuit 31 includes a voltage source 33 electrically connected to the conductive layer 62. The voltage source 33 may be distinct from the voltage source for applying a write voltage to the gate electrode 20 to cause the polarity of the ferroelectric layer 18 to switch. In some embodiments, the conductive layer 62 is disposed on two conductive contacts, such as the conductive contacts 42 shown in FIG. 9F, and the voltage source 33 generates a potential difference across the two conductive contacts. As a result, a current flows through the conductive layer 62 and generates heat in the conductive layer 62 by Joule heating due to the electrical resistance of the conductive layer 62. The heat is then transferred to the dielectric layer 60, which is then transferred to the gate electrode 20, and ultimately transferred to the ferroelectric layer 18. Similar to the heater circuit 23, the purpose of the heater circuit 31 is to increase the temperature of the ferroelectric layer 18 during write operation, such as to increase the temperature of the ferroelectric layer 18 by about 10 degrees Celsius to about 99 degrees Celsius. The conductive layer 62 may be heated during the operation of the FeFET 10.

Figure 15:
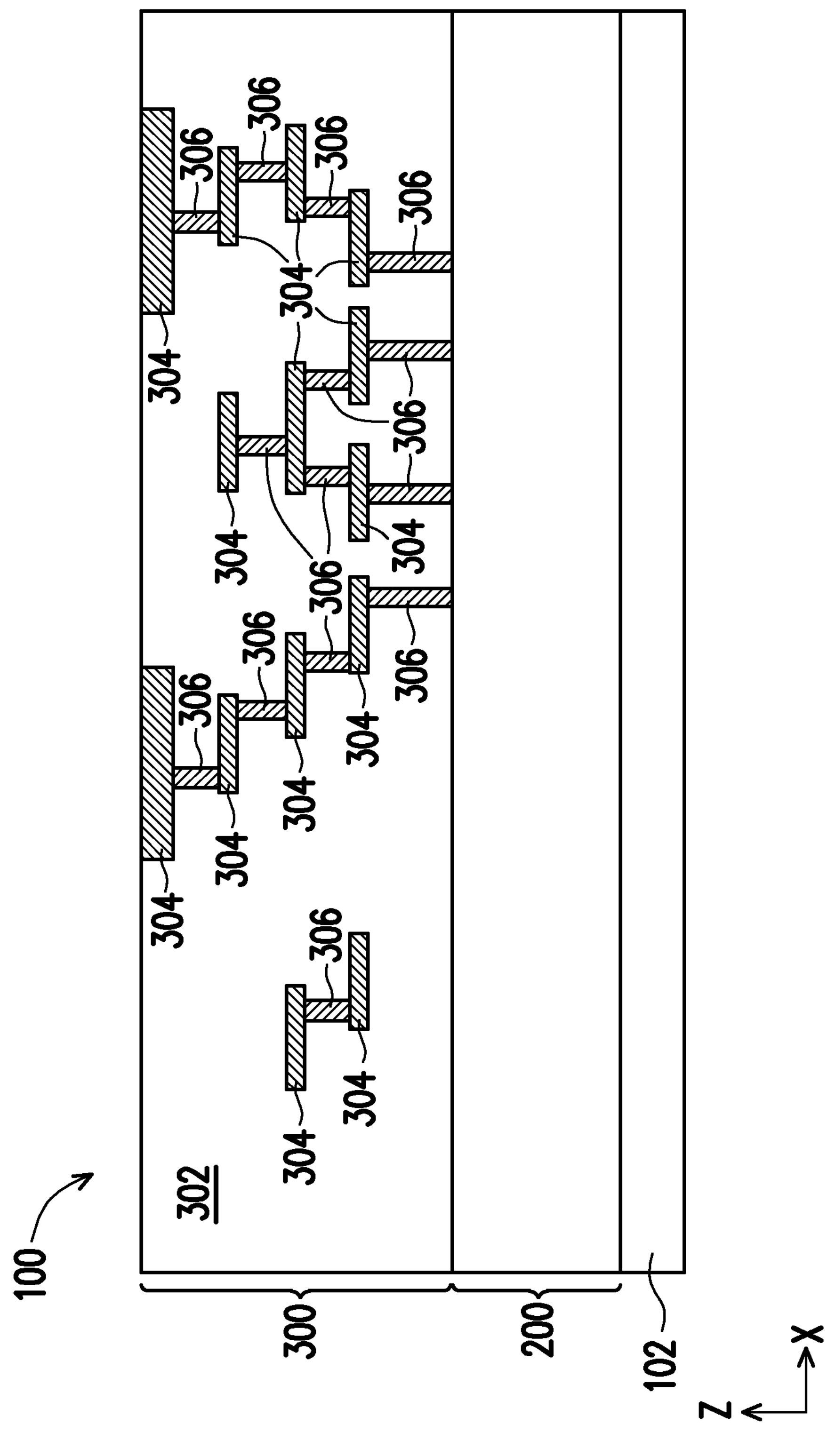
FIG. 15 is a cross-sectional side view of a semiconductor device structure, in accordance with some embodiments.

FIG. 15 is a cross-sectional side view of a semiconductor device structure 100, in accordance with some embodiments. As shown in FIG. 15, the semiconductor device structure 100 includes a substrate 102 and a device layer 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one embodiment, the insulating layer is an oxygen-containing material, such as an oxide.

The substrate 102 may include various regions that have been suitably doped with impurities (e.g., p-type or n-type impurities). The dopants are, for example phosphorus or arsenic for an n-type field effect transistor (FET) and boron for a p-type FET.

The device layer 200 includes a plurality of devices, such as transistors, diodes, imaging sensors, resistors, capacitors, inductors, memory cells, or a combination thereof. In some embodiments, the devices are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding portions of the channels.

The semiconductor device structure 100 may further includes an interconnect structure 300 disposed over the device layer 200 and the substrate 102, as shown in FIG. 15. The interconnect structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnect structure 300 includes multiple levels of the conductive features 304, and the conductive features 304 are arranged in each level to provide electrical paths to various devices disposed below. The conductive features 306 provide vertical electrical routing from the devices to the conductive features 304 and between conductive features 304. The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers.

Figure 16:
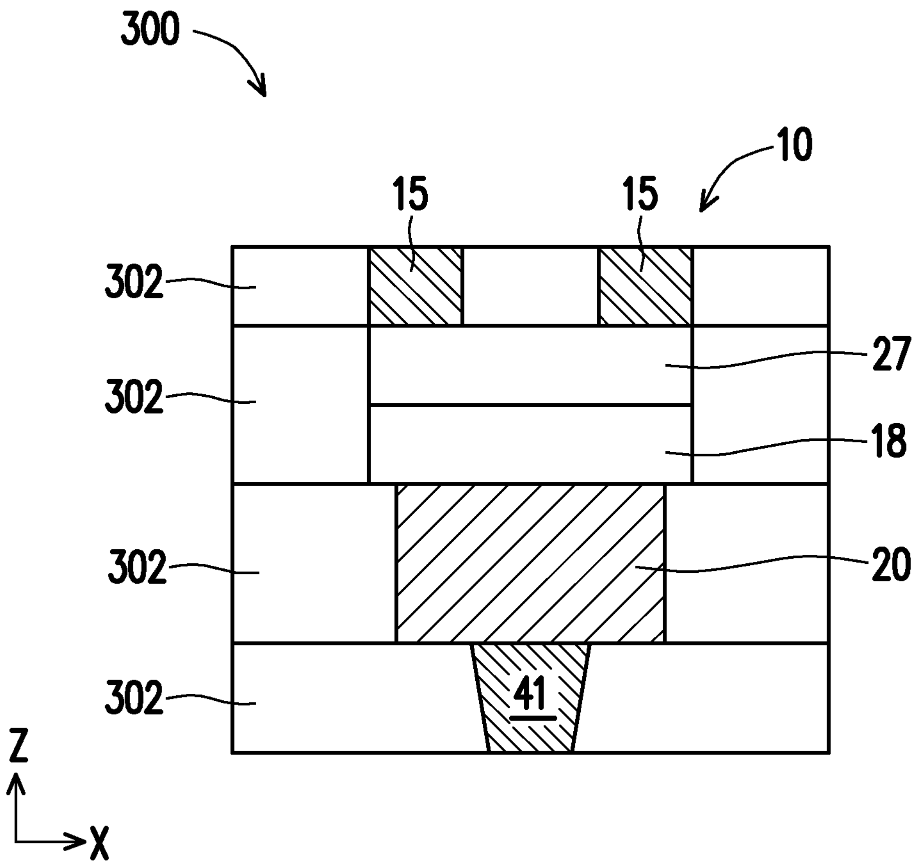
FIG. 16 is a cross-sectional side view of an interconnect structure, in accordance with some embodiments.

FIG. 16 is a cross-sectional side view of the interconnect structure 300, in accordance with some embodiments. The FeFET 10 shown in FIG. 14A or 14B may be disposed in the interconnect structure 300, such as in multiple IMD layers 302. For example, as shown in FIG. 16, two conductive contacts 41 (one of which is shown) are disposed in a first IMD layer 302, the gate electrode 20 is disposed on the conductive contacts 41 in a second IMD layer 302, the ferroelectric layer 18 and the channel layer 27 are disposed over the gate electrode 20 in a third IMD layer 302, and the S/D regions 15 are disposed over the channel layer 27 in a fourth IMD layer 302. The components of the FeFET 10 may be formed by forming openings in the IMD layers 302 and then fill the openings with the corresponding components. Additional layers may be formed in the IMD layers 302 as part of the FeFET 10. As described above, a current flows from one of the two conductive contacts 41 disposed at one end of the gate electrode 20 through the gate electrode 20 to the other of the two conductive contacts 41 disposed at the opposite end of the gate electrode 20 to generate heat in the gate electrode 20, which increases the temperature of the ferroelectric layer 18 before write operation of the FeFET 10.

Figure 17A:
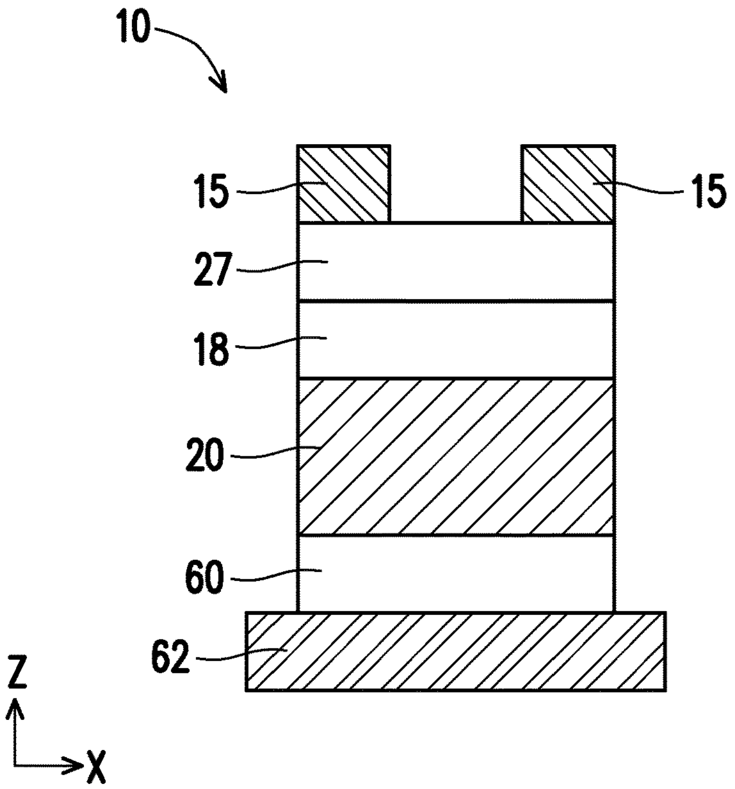
FIGS. 17A-17D are cross-sectional side views of the ferroelectric field effect transistor of FIG. 14B, in accordance with some embodiments.
Figure 17B:
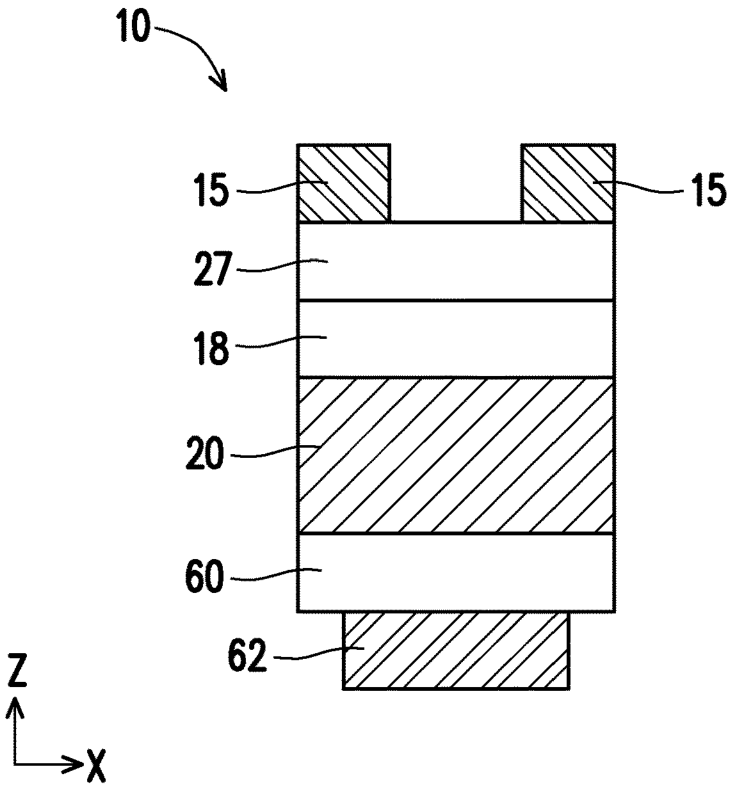

FIGS. 17A-17D are cross-sectional side views of the FeFET 10 of FIG. 14B, in accordance with some embodiments. As shown in FIG. 17A, in some embodiments, the length of the dielectric layer 60 in the x direction is substantially the same as the length of the gate electrode 20, and the length of the conductive layer 62 is substantially greater than the length of the dielectric layer 60. In some embodiments, as shown in FIG. 17B, the length of the conductive layer 62 is substantially less than the length of the dielectric layer 60.

Figure 17C:
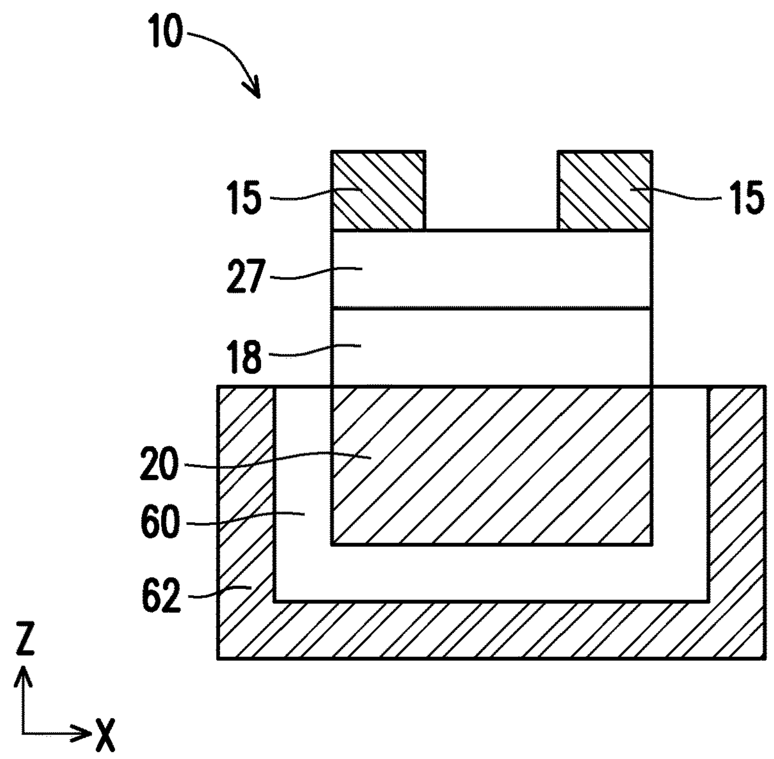
Figure 17D:
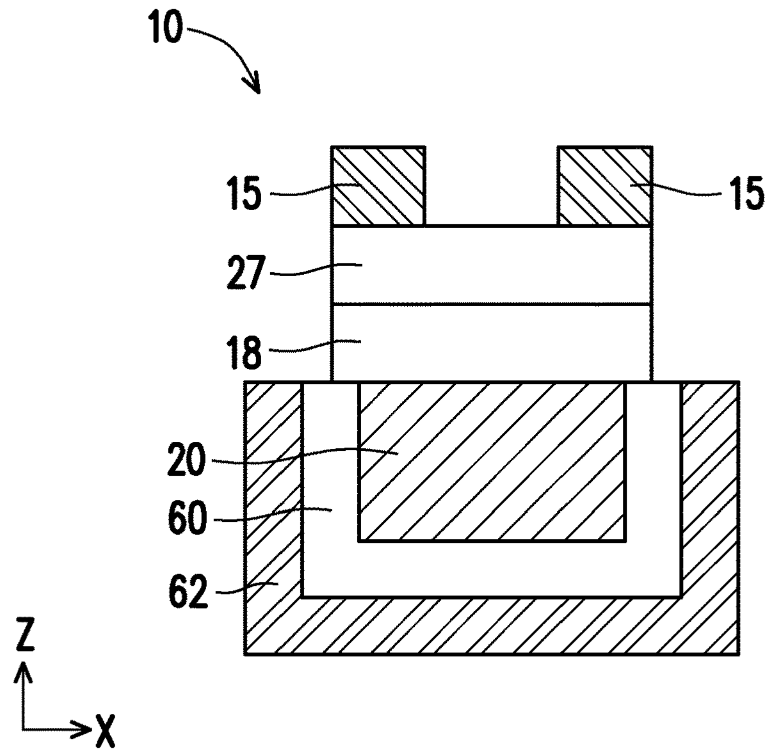

As shown in FIG. 17C, in some embodiments, the dielectric layer 60 and the conductive layer 62 cover three sides of the gate electrode 20 for improved heating of the gate electrode 20. The gate electrode 20 may have a length along the x direction substantially the same as a length of the ferroelectric layer 18, as shown in FIG. 17C, or the gate electrode 20 may have a length substantially less than a length of the ferroelectric layer 18, as shown in FIG. 17D.

Figure 18A:
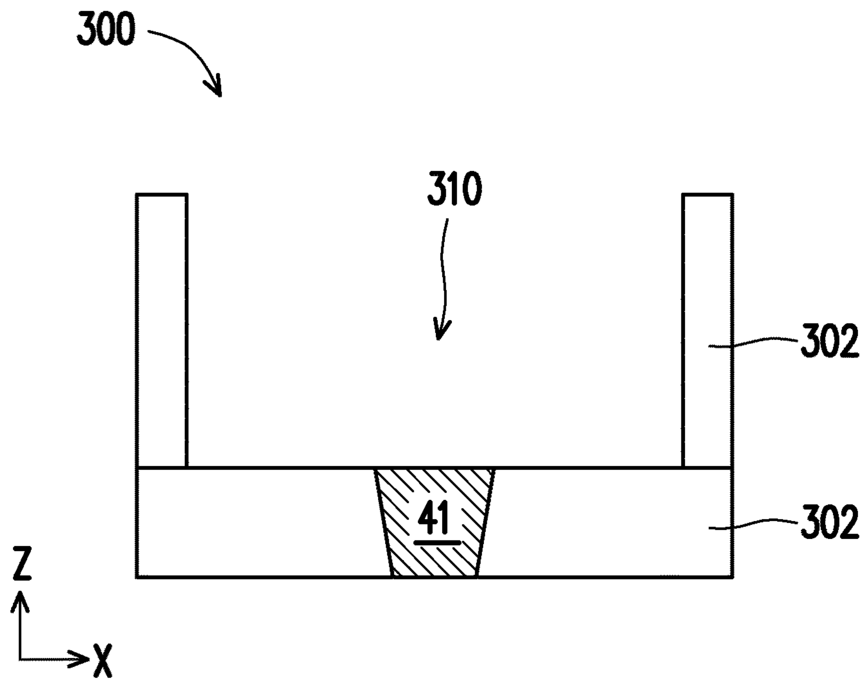
FIGS. 18A-18E are cross-sectional side views of various stages of manufacturing the ferroelectric field effect transistor of FIG. 17C, in accordance with alternative embodiments.
Figure 18B:
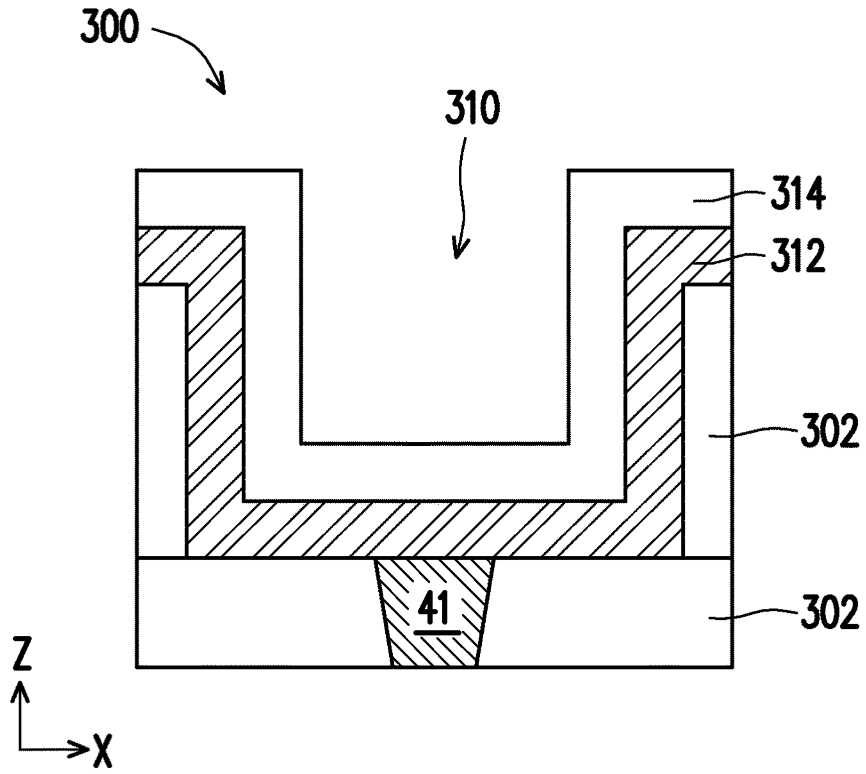

FIGS. 18A-18E are cross-sectional side views of various stages of manufacturing the FeFET 10 of FIG. 17C in the interconnect structure 300, in accordance with alternative embodiments. The FeFET 10 shown in FIGS. 17A to 17D may be formed by any suitable processes. FIGS. 18A to 18E illustrate one process flow of forming the FeFET 10 shown in FIG. 17C. As shown in FIG. 18A, two conductive contacts 41 (of which one is shown) are disposed in a first IMD layer 302. A second IMD layer 302 is formed on the first IMD layer 302 and the conductive contacts 41, and an opening 310 is formed in the second IMD layer 302. In some embodiments, the opening 310 is a trench. Next, as shown in FIG. 18B, a conductive layer 312 is formed in the opening 310 and on the second IMD layer 302, and a dielectric layer 314 is formed on the conductive layer 312. The conductive layer 312 may include the same material as the conductive layer 62, and the dielectric layer 314 may include the same material as the dielectric layer 60. The conductive layer 312 and the dielectric layer 314 may be conformal layers formed by ALD.

Figure 18C:
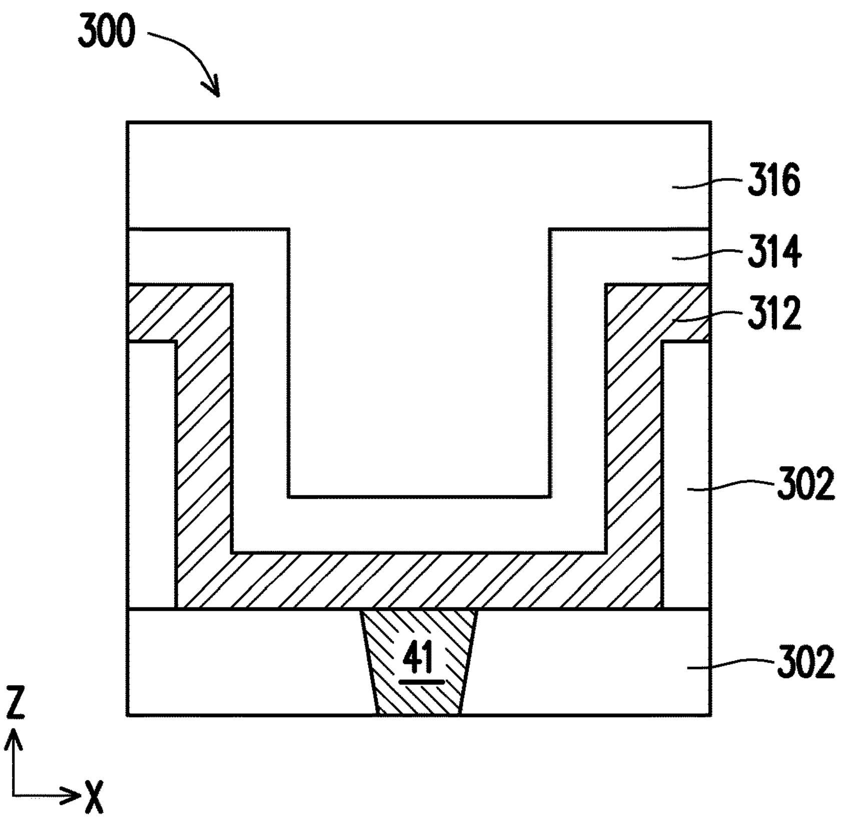
Figure 18D:
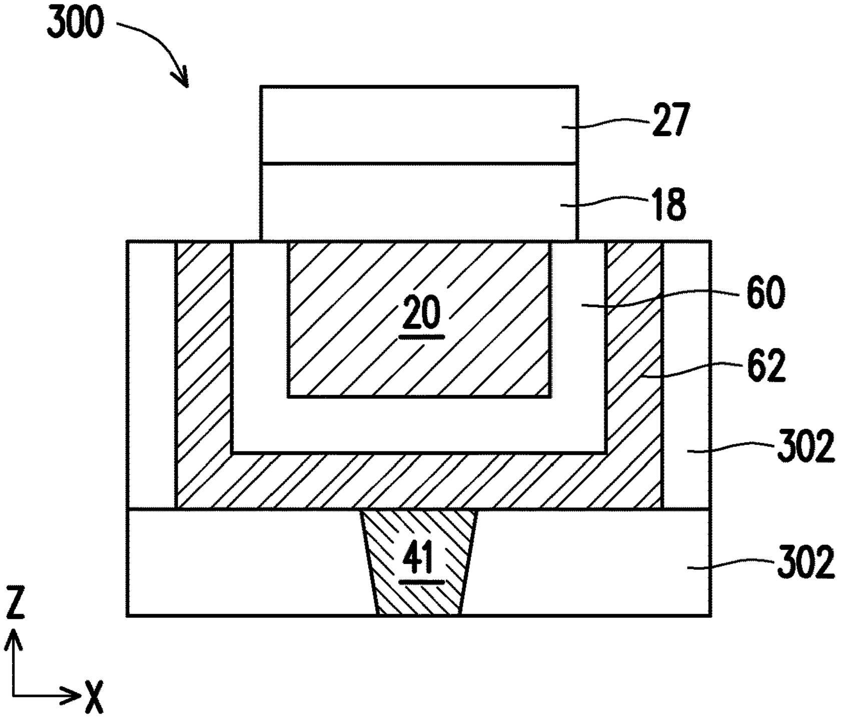

As shown in FIG. 18C, a conductive material 316 is formed in the opening 310 and over the second IMD layer 302. The conductive material 316 may include the same material as the gate electrode 20. Next, as shown in FIG. 18D, a planarization process may be performed to remove portions of the conductive layer 312, the dielectric layer 314, and the conductive material 316. The remaining conductive layer 312, dielectric layer 314, and conductive material 316 may be the conductive layer 62, the dielectric layer 60, and the gate electrode 20, respectively. The ferroelectric layer 18 and the channel layer 27 may be formed on the gate electrode 20, as shown in FIG. 18D. In some embodiments, the length of the ferroelectric layer 18 along the x direction may be substantially the same as the length of the gate electrode 20. In some embodiments, the length of the ferroelectric layer 18 may be substantially greater than the length of the gate electrode 20. The length of the ferroelectric layer 18 may be substantially the same as the length of the channel layer 27. The gate electrode 20 has a first width along the y direction, the ferroelectric layer 18 has a second width, and the channel layer 27 has a third width. In some embodiments, the second width may be substantially the same or less than the first width, and the third width may be substantially the same or substantially less than the first width.

Figure 18E:
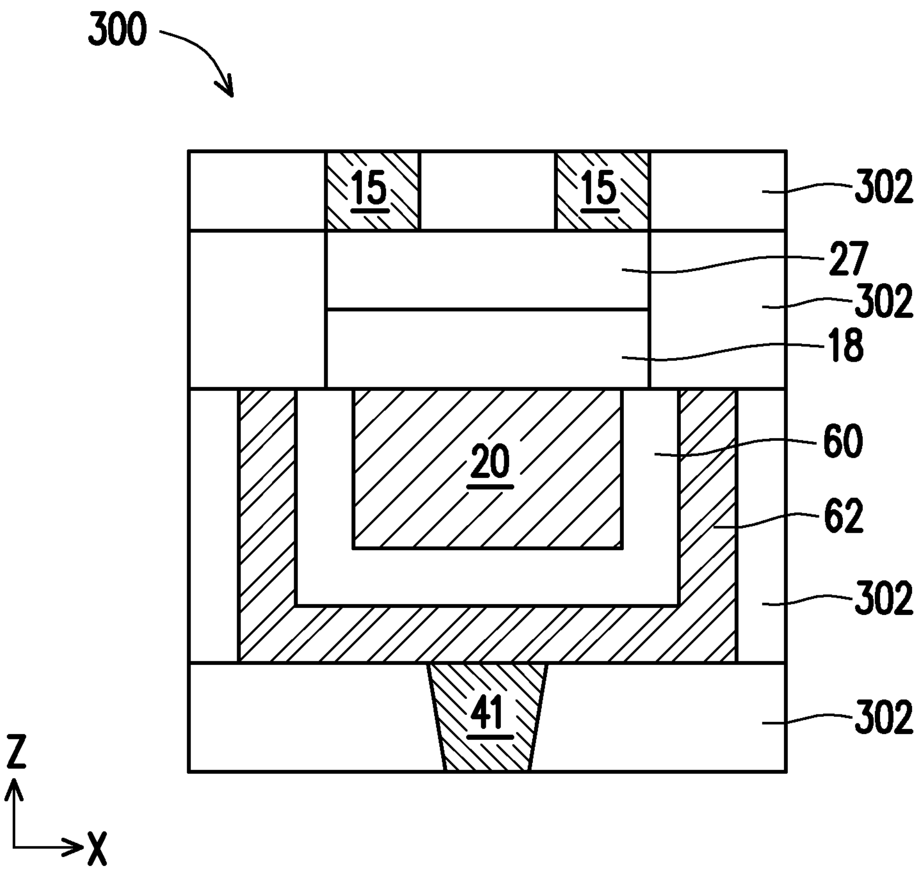

Next, as shown in FIG. 18E, a third IMD layer 302 may be formed around the ferroelectric layer 18 and the channel layer 27, a fourth IMD layer 302 is formed on the third IMD layer 302 and the channel layer 27, openings are formed in the fourth IMD layer 302 to expose portions of the channel layer 27, and the S/D regions 15 are formed in the openings. In some embodiments, the S/D region 15 has a fourth width substantially the same as the third width. In some embodiments, multiple channel layers 27 and pairs of the S/D regions 15 are formed in parallel along the y direction, and the gate electrode 20 may be under the multiple channel layers 27 and pairs of the S/D regions 15. As a result, a row of FeFETs 10 is formed.

Figure 19A:
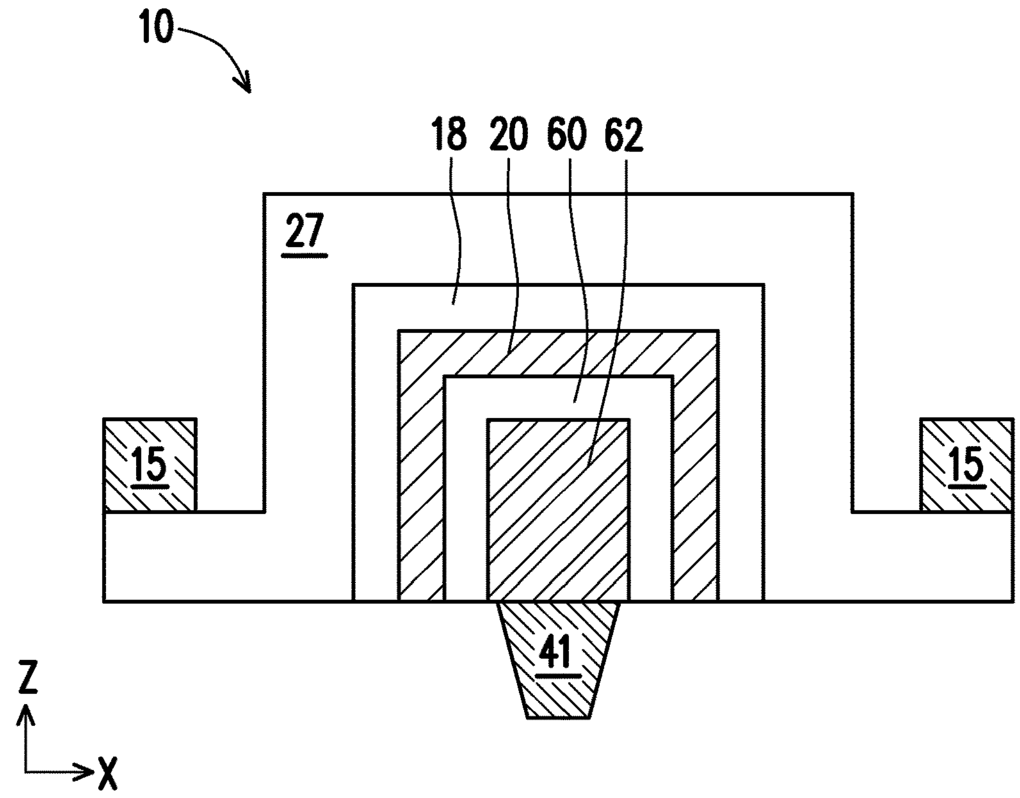
FIGS. 19A and 19B are cross-sectional side views of the ferroelectric field effect transistor, in accordance with alternative embodiments.
Figure 19B:
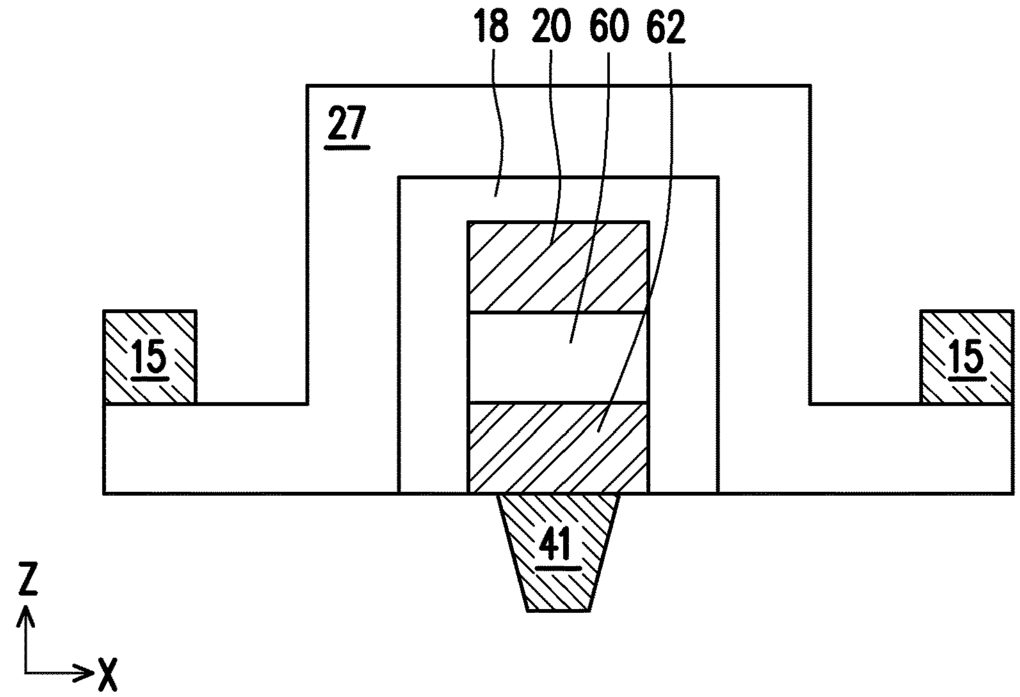

FIGS. 19A and 19B are cross-sectional side views of the FeFET 10, in accordance with alternative embodiments. In some embodiments, the channel layer 27 of the FeFET 10 may be non-planar for improved channel properties. In some embodiments, as shown in FIG. 19A, the conductive layer 62 is first formed on the two conductive contacts 41 (of which one is shown), followed by forming the dielectric layer 60, the gate electrode 20, the ferroelectric layer 18, and the channel layer 27 to surround three sides of the conductive layer 62. In some embodiments, the dielectric layer 60, the gate electrode 20, the ferroelectric layer 18, and the channel layer 27 may be all conformal layers and may be formed by ALD. The S/D regions 15 may be formed on opposite ends of the channel layer 27, as shown in FIG. 19A.

In some embodiments, a stack of the conductive layer 62, the dielectric layer 60, and the gate electrode 20 are first formed, and the ferroelectric layer 18 and the channel layer 27 are formed to surround three sides of the stack of the conductive layer 62, the dielectric layer 60, and the gate electrode 20, as shown in FIG. 19B. The FeFET 10 may incorporate the dielectric layer 60, the conductive layer 62, and the conductive contacts 41 in any manner.

Figure 20:
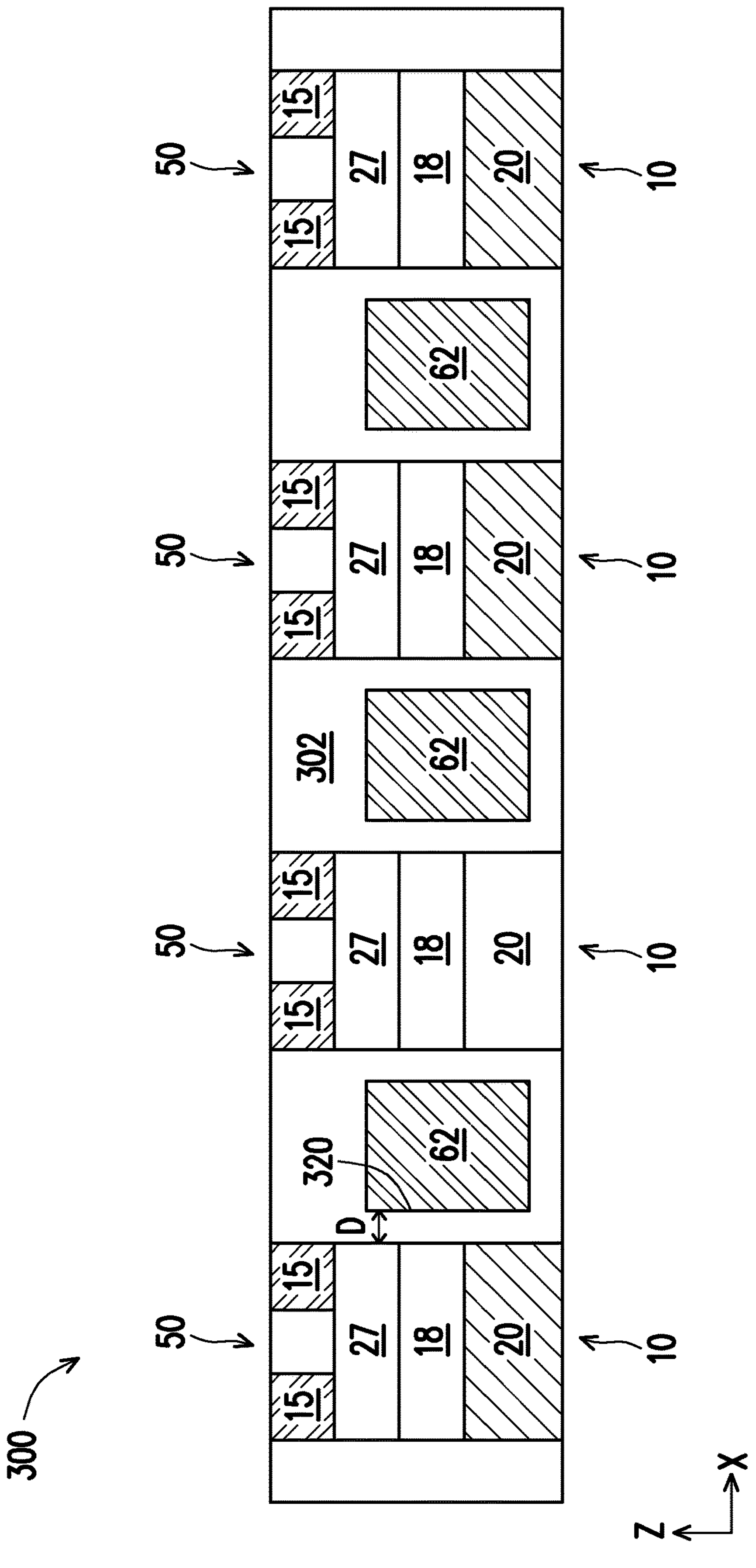
FIG. 20 is a cross-sectional side view of the interconnect structure including rows of ferroelectric field effect transistors separated by conductive layers, in accordance with some embodiments.

FIG. 20 is a cross-sectional side view of the interconnect structure 300 including rows of FeFETs 10 separated by the conductive layers 62, in accordance with some embodiments. In some embodiments, a plurality of rows 50 of FeFETs 10 are disposed in the IMD layer 302, and the conductive layer 62 is disposed between adjacent rows 50, as shown in FIG. 20. The conductive layer 62 is not incorporated into the FeFET 10. Thus, in some embodiments, each row 50 of the FeFETs 10 include any suitable FeFET including channel region, such as planar channel region FeFET, non-planar channel region FeFET, back-gate FeFET, or front-gate FeFET. Each conductive layer 62 includes sides 320, and each side 320 is a distance D away from the adjacent FeFET 10. In some embodiments, the distance D ranges from about 5 nm to about 10 nm. If the distance D is less than about 5 nm, electrical short may occur during the operation of the FeFETs 10. On the other hand, if the distance D is greater than about 10 nm, the heating of the gate electrode 20 and the ferroelectric layer 18 may become inefficient. The bottom of the conductive layer 62 may be located at a level above the level of a bottom of the gate electrode 20, and the top of the conductive layer 62 may be located at a level below the level of a top of the channel layer 27 in order to heat the gate electrode 20 and the ferroelectric layer 18 efficiently. Each conductive layer 62 is electrically connected to two conductive contacts (not shown), which may be disposed on the top of the conductive layer 62 or below the conductive layer 62.

Figure 21A:
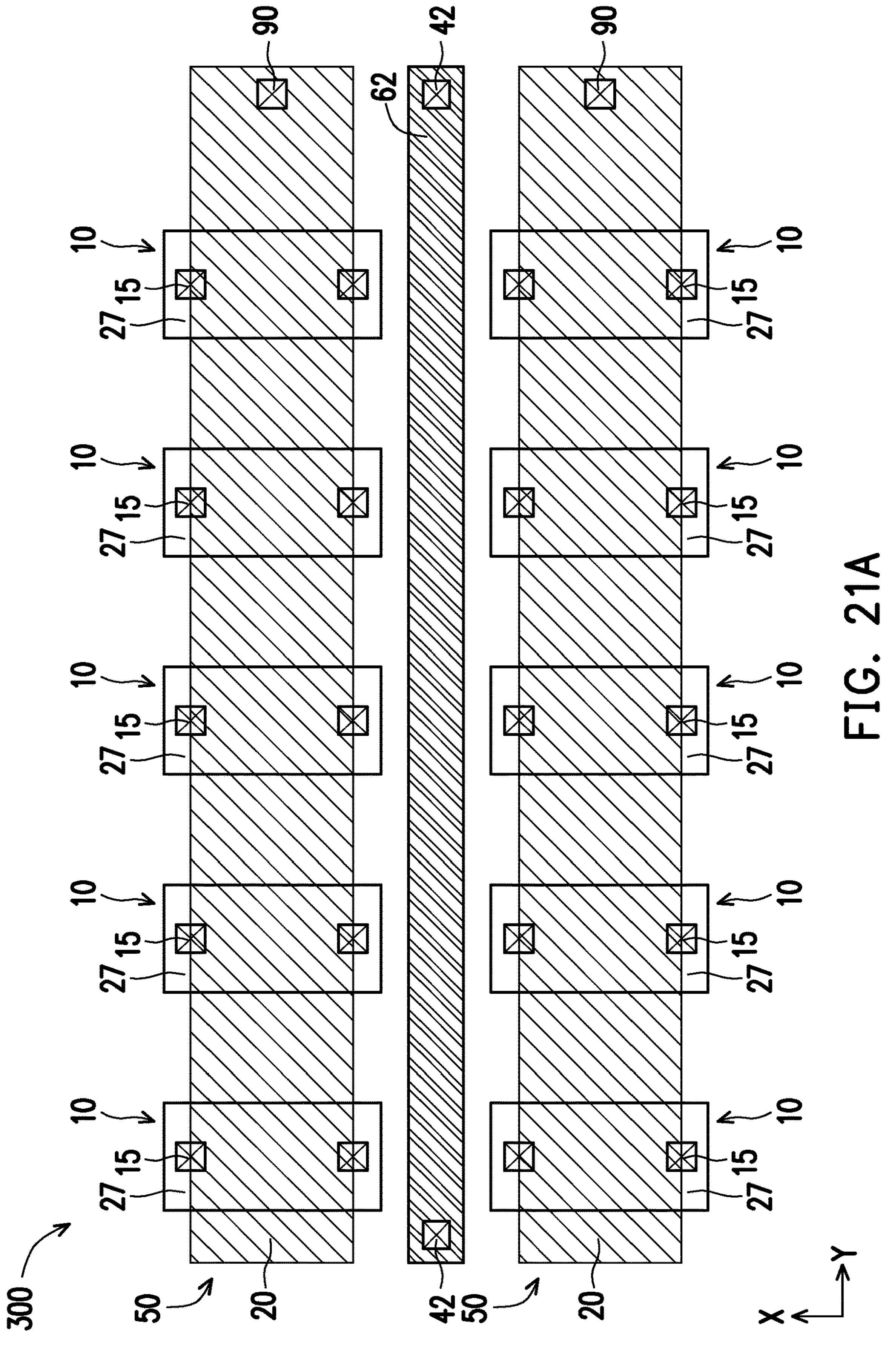
FIGS. 21A-21C are top views of the interconnect structure, in accordance with some embodiments.
Figure 21B:
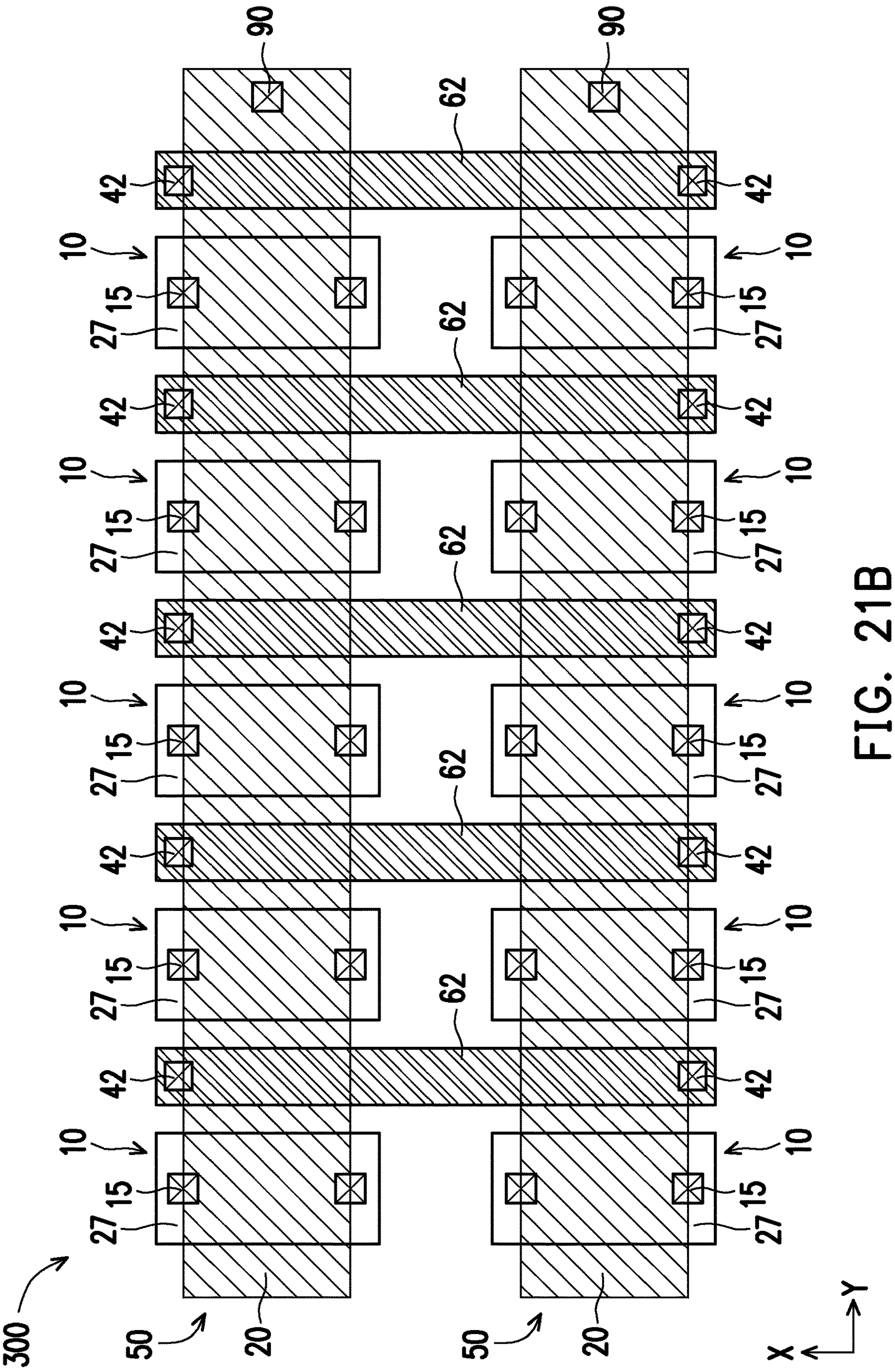
Figure 21C:
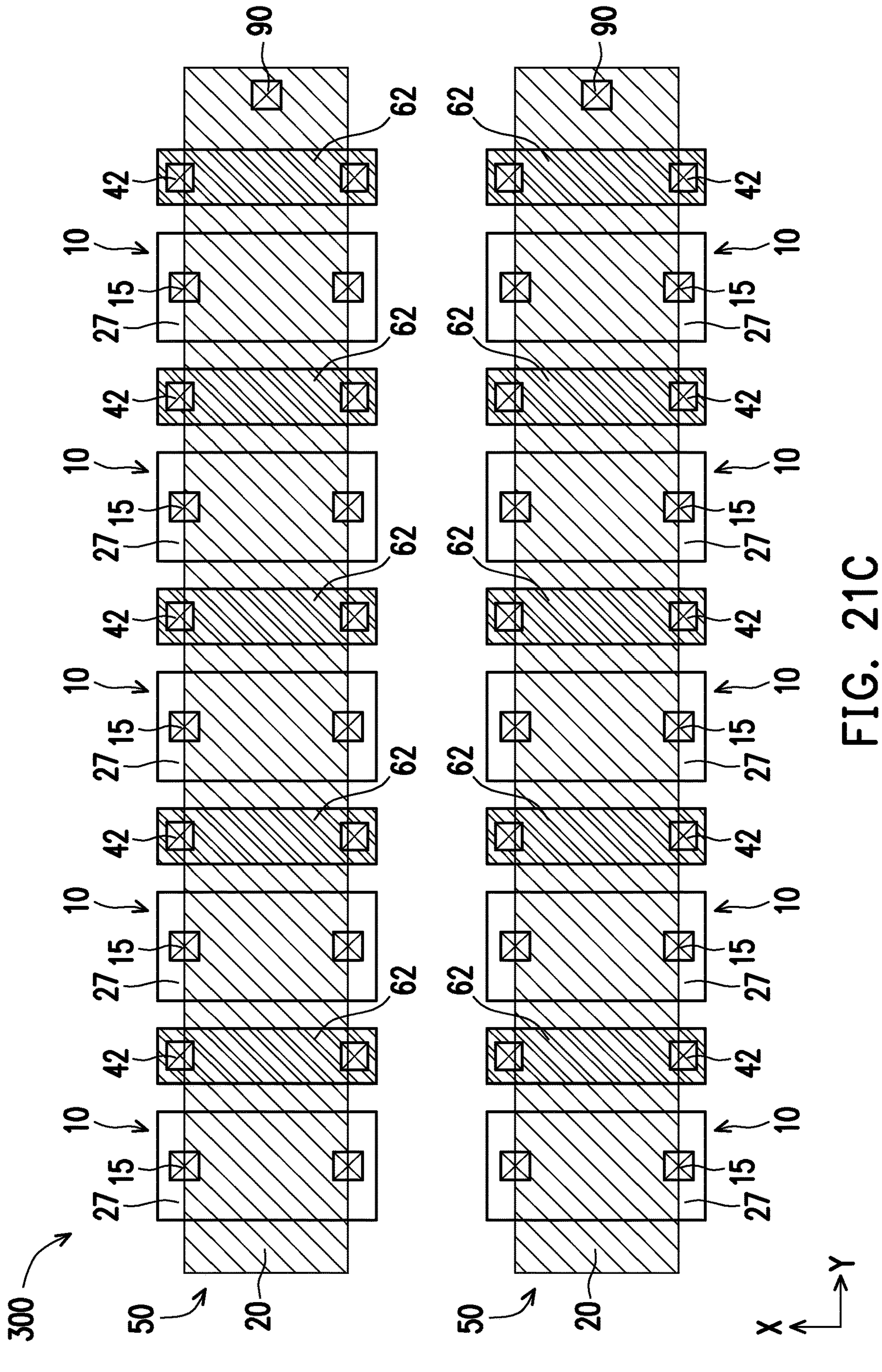

FIGS. 21A-21C are top views of the interconnect structure 300, in accordance with some embodiments. Some components of the interconnect structure 300, such as the IMD layer 302, may be omitted for clarity in FIGS. 21A to 21C. Furthermore, the components shown in FIGS. 21A to 21C may be located at different levels along the z direction. As shown in FIG. 21A, the interconnect structure 300 includes two rows 50 of the FeFETs 10, and each row 50 of the FeFETs 10 includes five FeFETs 10. However, the row 50 may include any number of the FeFETs 10. The FeFETs 10 shown in FIGS. 21A to 21C may be the FeFETs 10 shown in FIG. 14A. Other suitable FeFETs may be used. As shown in FIG. 21A, each FeFET 10 includes channel layer 27 functioning as the channel region, and the S/D regions 15 are disposed on the channel layer 27. The five FeFETs 10 share one gate electrode 20, which is disposed below the channel layer 27. In some embodiments, the gate electrode 20 may have a length along the x direction substantially less than a length of the channel layer 27, as shown in FIG. 21A. In some embodiments, the length of the gate electrode 20 may be substantially the same as the length of the channel layer 27. The conductive contact 90 is disposed on one end of the gate electrode 20. The conductive layer 62 is disposed between the rows 50 of FeFETs 10, and the two conductive contacts 42 are disposed on opposite ends of the conductive layer 62. As described above, the conductive layer 62 may be part of a heater circuit (not shown), and a current is flowed from one of the two conductive contacts 42 through the conductive layer 62 to the other conductive contact 42 in order to heat the conductive layer 62 by Joule heating. As a result, the gate electrode 20 and the ferroelectric layer 18 are heated by the conductive layer 62 due to close proximity. The conductive layer 62 may be heated before or during write operation of the FeFETs 10. The temperature of the ferroelectric layer 18 of the FeFETs 10 may be increased by about 10 degrees Celsius to about 99 degrees Celsius by the heat from the conductive layer 62.

In some embodiments, the conductive layer 62 is oriented substantially parallel to the gate electrode 20, as shown in FIG. 21A, and the interconnect structure 300 shown in FIG. 21A may be the top view of the interconnect structure 300 shown in FIG. 20. In some embodiments, the conductive layer 62 is oriented substantially perpendicular to the gate electrode 20, as shown in FIG. 21B. In some embodiments, the conductive layer 62 is disposed between adjacent FeFETs 10 within the row 50, and the conductive layer 62 may extend across multiple rows 50 of FeFETs 10. The conductive layer 62 may be disposed below the gate electrode 20 with the IMD layer 302 disposed between the conductive layer 62 and the gate electrode 20. In other words, the plurality of conductive layers 62 shown in FIG. 21B may be disposed below the rows 50 of FeFETs 10, so the conductive layers 62 and the gate electrode 20 are in close proximity.

In some embodiments, the conductive layer 62 does not extend across multiple rows 50 of FeFETs 10, as shown in FIG. 21C. For example, each conductive layer 62 may have a first edge substantially aligned with an edge of one of the S/D regions 14 of a FeFET 10 and a second edge substantially aligned with an edge of the other of the S/D regions 14 of the FeFET 10.

The present disclosure provides a FeFET 10 having a ferroelectric layer 18 that can be heated before or during the write operation of the FeFET 10. In some embodiments, a gate electrode 20 of the FeFET 10 is heated before write operation of the FeFET 10. In some embodiments, a conductive layer 62 is heated during the write operation of the FeFET 10. Some embodiments may achieve advantages. For example, the heated ferroelectric layer 18 has a reduced potential barrier between different polarization states, reducing the coercive field. As a result, write voltage may be reduced.

An embodiment is a device. The device includes a substrate, source/drain regions disposed over the substrate, a ferroelectric layer disposed over the substrate, a gate electrode in contact with the ferroelectric layer, a first conductive contact disposed at a first end of the gate electrode, and a second conductive contact disposed at a second end opposite the first end of the gate electrode. The first and second conductive contacts are configured to allow a current to flow from the first conductive contact through the gate electrode to the second conductive contact.

Another embodiment is a device. The device includes source/drain regions, a channel region electrically connected to the source/drain regions, a ferroelectric layer disposed over or below the channel region, and a gate electrode. The ferroelectric layer is disposed between the gate electrode and the channel region. The device further includes a dielectric layer in contact with the gate electrode, a conductive layer in contact with the dielectric layer, a first conductive contact disposed at a first end of the conductive layer, and a second conductive contact disposed at a second end opposite the first end of the conductive layer. The first and second conductive contacts are configured to allow a current to flow from the first conductive contact through the conductive layer to the second conductive contact A further embodiment is an interconnect structure. The structure includes a first row of first plurality of devices, and each device of the first plurality of devices includes first source/drain regions, a first ferroelectric layer, and a first gate electrode. The structure further includes a second row of second plurality of devices, and each device of the second plurality of devices includes second source/drain regions, a second ferroelectric layer, and a second gate electrode. The structure further includes a conductive layer configured to increase a temperature of the first and second ferroelectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device, comprising:

a substrate;

source/drain regions disposed over the substrate;

a ferroelectric layer disposed over the substrate;

a gate electrode disposed over the ferroelectric layer;

a conductive layer disposed over the gate electrode;

a first conductive contact disposed at a first end of the conductive layer; and a second conductive contact disposed at a second end opposite the first end of the conductive layer, wherein the first and second conductive contacts are configured to allow a current to flow from the first conductive contact through the conductive layer to the second conductive contact.

2. The device of claim 1, wherein the device is a planar ferroelectric field effect transistor.

3. The device of claim 1, wherein the device is a fin field effect transistor.

4. The device of claim 1, wherein the conductive layer includes alternating first and second portions, the first portion has a first length, and the second portion has a second length different from the first length.

5. The device of claim 4, wherein the first portion is disposed over an active region and the second portion is disposed over an isolation layer.

6. The device of claim 4, wherein the first length is substantially greater than the second length.

7. The device of claim 4, wherein the second length is substantially greater than the first length.

8. The device of claim 4, wherein the first and second portions include different materials.

9. The device of claim 4, wherein the gate electrode has a third length less than the first and greater than the second length.

10. A device, comprising:

source/drain regions;

a channel region electrically connected to the source/drain regions;

a ferroelectric layer disposed over the channel region;

a gate electrode, wherein the ferroelectric layer is disposed between the gate electrode and the channel region;

a dielectric layer disposed over the gate electrode;

a conductive layer disposed over the dielectric layer;

a first conductive contact disposed at a first end of the conductive layer; and a second conductive contact disposed at a second end opposite the first end of the conductive layer, wherein the first and second conductive contacts are configured to allow a current to flow from the first conductive contact through the conductive layer to the second conductive contact.

11. The device of claim 10, wherein the conductive layer comprises Ti, TiAl, TiN, or Pt.

12. The device of claim 10, further comprising an interfacial layer disposed between the channel region and the ferroelectric layer.

13. The device of claim 12, wherein the interfacial layer is disposed on the channel region, the ferroelectric layer is disposed on the interfacial layer, and the gate electrode is disposed on the ferroelectric layer.

14. The device of claim 13, wherein the conductive layer covers three sides of the gate electrode.

15. The device of claim 13, wherein the conductive layer and the dielectric layer have different lengths.

16. The device of claim 10, wherein the conductive layer has a varying length.

17. A structure, comprising:

a row of plurality of devices, wherein each device of the plurality of devices comprises:

source/drain regions;

a ferroelectric layer; and a gate electrode; and a conductive layer disposed over the gate electrode and configured to increase a temperature of the ferroelectric layer.

18. The structure of claim 17, wherein the conductive layer has a varying length.

19. The structure of claim 18, wherein the conductive layer has a width less than a width of the gate electrode.

20. The structure of claim 17, wherein the plurality of devices are ferroelectric field effect transistors.

* * * * *